(12) United States Patent
Ando et al.

(10) Patent No.: US 6,528,348 B2
(45) Date of Patent: Mar. 4, 2003

(54) SEMICONDUCTOR DEVICE HAVING PROTRUDING ELECTRODES HIGHER THAN A SEALED PORTION

(75) Inventors: Fumihiko Ando, Kawasaki (JP); Akira Takashima, Kawasaki (JP); Hiroshi Onodera, Miyagi (JP); Eiji Yoshida, Kawasaki (JP); Kazuo Teshirogi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/076,580

(22) Filed: Feb. 19, 2002

(65) Prior Publication Data
US 2002/0074630 A1 Jun. 20, 2002

Related U.S. Application Data

(63) Continuation of application No. 09/605,687, filed on Jun. 27, 2000, now Pat. No. 6,388,333.

(30) Foreign Application Priority Data

Nov. 30, 1999 (JP) ............................................ 11-340816
Mar. 13, 2000 (JP) ......................................... 2000-068986

(51) Int. Cl.[7] ................................................. H01L 29/40
(52) U.S. Cl. ......................................... 438/109; 438/112
(58) Field of Search ................................. 438/112, 124, 438/127, 107, 109, 110

(56) References Cited

U.S. PATENT DOCUMENTS

| 5,594,275 A | 1/1997 | Kwon et al. |
| 6,025,648 A | 2/2000 | Takahashi et al. |
| 6,072,233 A | 6/2000 | Corisis et al. |

FOREIGN PATENT DOCUMENTS

| JP | 08236694 | 9/1996 |
| JP | 09148482 | 6/1997 |

*Primary Examiner*—Roy Potter
(74) *Attorney, Agent, or Firm*—Armstrong, Westerman & Hattori, LLP

(57) ABSTRACT

A plurality of semiconductor devices can be mounted on a mounting board in a three-dimensional structure by stacking one on another with a simple structure. A semiconductor element is mounted on a first surface of an interposer. Electrode pads connected to the semiconductor element are arranged around the semiconductor element on the first surface of the interposer. Protruding electrodes are provided on the respective electrode pads. Through holes are formed in the interposer so as to extend from a second surface opposite to the first surface of the redistribution substrate to the respective electrode pads. The semiconductor element is encapsulated by a seal resin. Each of the protruding electrodes is higher than the sealed portion of the semiconductor element.

3 Claims, 30 Drawing Sheets

FIG.31

| | | INTERPOSER | EXT. TERMINAL | | WIRING METHOD | | | CHIP | |
|---|---|---|---|---|---|---|---|---|---|
| | | | BGA | LGA | WIRE | FLIP | TAB | SAME KIND | DIFFERENT KINDS |
| 2 CHIPS | | 2 | ○ | × | ○ | ○ | ○ | ○ | ○ |
| | | 2 | ○ | ○ | ○ | ○ | ○ | ○ | ○ |
| | | 1 | ○ | × | ○ | ○ | ○ | ○ | ○ |
| | | 1 | ○ | × | ○ | (UPPER) ○ | ○ | ○ | ○ |
| | | | | | | (LOWER) × | ○ | | |
| | | 1 | ○ | ○ | ○ | (UPPER) × | ○ | ○ | ○ |
| | | | | | | (LOWER) ○ | ○ | | |

| | | INTERPOSER | EXT. TERMINAL | | WIRING METHOD | | | CHIP | |
|---|---|---|---|---|---|---|---|---|---|
| | | | BGA | LGA | WIRE | FLIP | TAB | SAME KIND | DIFFERENT KINDS |
| 3 CHIPS |  | 3 | ○ | × | ○ | ○ | ○ | ○ | ○ |
| |  | 3 | ○ | ○ | ○ | ○ | ○ | ○ | ○ |
| |  | 2 | ○ | × | ○ | ○ | ○ | ○ | ○ |
| |  | 1 | ○ | × | ○ | (UPPER) × <br> (MIDDLE) ○ <br> (LOWER) ○ | ○ <br> ○ <br> ○ | ○ <br> ○ | ○ |
| |  | 1 | ○ | × | ○ | (UPPER) ○ <br> (MIDDLE) ○ <br> (LOWER) × | ○ <br> ○ <br> ○ | ○ <br> ○ | ○ |
| | | 1 | ○ | ○ | ○ | (UPPER) × <br> (MIDDLE) × <br> (LOWER) ○ | ○ <br> ○ <br> ○ | × | ○ |
| | | 1 | ○ | × | ○ | (UPPER) ○ <br> (MIDDLE) × <br> (LOWER) × | ○ <br> ○ <br> ○ | × | ○ |

FIG.33

| | | INTERPOSER | EXT. TERMINAL | | WIRING METHOD | | | CHIP | |
|---|---|---|---|---|---|---|---|---|---|
| | | | BGA | LGA | WIRE | FLIP | TAB | SAME KIND | DIFFERENT KINDS |
| 4 CHIPS | | 4 | ○ | × | ○ | ○ | ○ | ○ | ○ |
| | | 4 | ○ | ○ | ○ | ○ | ○ | ○ | ○ |
| | | 3 | ○ | × | ○ | ○ | ○ | ○ | ○ |
| | | 2 | ○ | × | ○ | ○ | ○ | ○ | ○ |
| | | 2 | ○ | × | ○ | ○ / × / ○ / ×  | ○ | ○ / ○ | ○ / ○ |
| | | 2 | ○ | ○ | ○ | × / ○ / × / ○ | ○ | ○ / ○ | ○ / ○ |
| | | 1 | ○ | × | ○ | × / ○ / ○ / × | ○ | ○ / ○ | ○ / ○ |

SEMICONDUCTOR DEVICE HAVING PROTRUDING ELECTRODES HIGHER THAN A SEALED PORTION

This is a continuation of application Ser. No. 09/605,687 filed Jun. 27, 2000, now U.S. Pat. No. 6,388,333.

BACKGROUND OF THE INVENTION

1. Field of the Invention

The present invention generally relates to semiconductor devices and, more particularly, to a semiconductor device suitable for forming a three-dimensional structure in which a plurality of semiconductor devices are provided in a stacked state.

In association with reduction in size, weight and thickness of electronic apparatuses, reduction in size and thickness is required for semiconductor devices used in the electronic apparatuses. In order to satisfy such a requirement, a semiconductor package has been changed from a quadra-flat package to a ball grid array (BGA) package or chip size package (CSP).

A fan-out type package is popular among those packages. In the fan-out type package, a semiconductor chip is mounted on a redistribution substrate (generally referred to as an interposer) and external connection terminals are arranged around the semiconductor chip.

2. Description of the Related Art

FIG. 1 is a cross-sectional view of a conventional fan-out type semiconductor device. In FIG. 1, a semiconductor chip 3 is mounted on an interposer 1 that is formed of a polyimide substrate or a glass-epoxy substrate. The semiconductor chip 3 is encapsulated by a seal resin 2. The semiconductor chip 3 is fixed to the interposer 1 by a die-bonding material 6 in a face-up state in which a circuit forming surface of the semiconductor chip 3 faces upward. Bonding pads 5 and ball pads 8 are formed on the upper surface of the interposer 1, and the bonding pads 5 are connected to the respective ball pads 8 by wiring patterns.

Electrodes of the semiconductor chip 3 are connected to the respective bonding pads 5 by gold (Au) wires 4. The surface of the semiconductor chip 3 on which the semiconductor chip 3 is mounted is encapsulated by the seal resin 2 such as epoxy resin so as to protect the semiconductor chip 3, the Au wires 4, the bonding pads 5 and the ball pads 8. Additionally, VIA holes 9 are formed in the interposer 1 at positions corresponding to the ball pads 8 so that the ball pads 5 are exposed in the VIA holes 9. Solder balls 7 are provided on the bonding pads 5 serving as bottoms of the VIA holes 9 opening on the lower surface of the interposer 1. Accordingly, the semiconductor chip 3 is electrically connected to the solder balls 7 serving as external connection terminals via the interposer 1. The solder balls 7 protrude from the lower surface of the interposer 1.

FIG. 2 is a cross-sectional view of a CSP type semiconductor device in which a semiconductor chip is mounted by a flip-chip mounting method. In FIG. 2, parts that are the same as the parts shown in FIG. 1 are given the same reference numerals, and descriptions thereof will be omitted.

In FIG. 2, the semiconductor chip 3 is mounted on the interposer 1 by a flip-chip mounting method in a face-down state in which the circuit forming surface of the semiconductor chip 3 faces the interposer 1. That is, the semiconductor chip 3 has a connection bumps 12, which are connected to the bonding pads 5. An under fill material 11 is filled between the semiconductor chip 3 and the interposer 1 so that the semiconductor chip 3 is fixed to the interposer 1 by the under fill material 11. Similar to the semiconductor device shown in FIG. 1, through holes (VIA holes) 9 are provided in the interposer 1, and the solder balls 7 protrude from the lower surface of the interposer 1.

In the above-mentioned semiconductor devices, the mounting area of the package including the semiconductor chip is reduced so that the package size is reduced to almost the size of the semiconductor chip. Accordingly, the reduction in the two-dimensional size of the package is considered to be almost the limit. Thus, the reduction in size of the semiconductor devices must A be directed to the three-dimensional scheme. That is, in order to reduce the size of the semiconductor devices, consideration must be given on not only how to reduce a mounting area but also how to reduce a mounting volume.

SUMMARY OF THE INVENTION

It is a general object of the present invention to provide an improved and useful semiconductor device in which the above-mentioned problems are eliminated.

A more specific object of the present invention is to provide a semiconductor device which can directly connect to another semiconductor device in a stacked arrangement so that a plurality of the semiconductor devices can be mounted on a mounting board in a three-dimensional structure by stacking one on another.

In order to achieve the above-mentioned objects, there is provided according to one aspect of the present invention a semiconductor device comprising: a first semiconductor element; a redistribution substrate having a first surface and a second surface opposite to the first surface, the first semiconductor element being mounted on the first surface; a plurality of electrode pads arranged on the first surface of the redistribution substrate; the electrode pads being electrically connected to the first semiconductor element; a plurality of protruding electrodes provided on the respective electrode pads; and a plurality of through holes extending from the second surface of the redistribution substrate to the respective electrode pads, wherein the first semiconductor element is encapsulated by a seal material, and a height of each of the protruding electrodes from the first surface is larger than a height of a sealed portion of the first semiconductor element from the second surface.

According to the above-mentioned invention, the through holes are formed in the redistribution substrate such as an interposer so that the back side of the electrode pads are exposed on the bottom of the respective through holes. Additionally, each of the protruding electrodes is higher than the sealed portion of the first semiconductor element, when two semiconductor devices are stacked one on another, the sealed portion of the upper semiconductor device can be accommodated in a space between the redistribution substrates of the upper and lower semiconductor devices while the protruding electrodes of the upper semiconductor device are bonded to the electrode pads of the lower semiconductor device through the through holes of the redistribution substrate of the lower semiconductor device. That is, the distance between the upper semiconductor device and the lower semiconductor device can be defined only by the protruding electrodes of the upper semiconductor device being bonded to the electrode pads of the lower semiconductor device. Thus, the stacked structure of the semiconductor devices can be achieved in a simple structure. Additionally, the electrode pads can be freely positioned around the first semiconductor element on the first surface of the redistribution substrate by forming wiring patterns on the first surface under the first semiconductor element.

Additionally, there is provided according to another aspect of the present invention a semiconductor device comprising: a first semiconductor element; a redistribution substrate having a first surface and a second surface opposite to the first surface, the first semiconductor element being mounted on the first surface; a plurality of electrode pads arranged on the first surface of the redistribution substrate, the electrode pads being electrically connected to the first semiconductor element; a plurality of through holes extending from the second surface of the redistribution substrate to the respective electrode pads; and a plurality of protruding electrodes formed on the respective electrode pads through the respective through holes, wherein the first semiconductor element is encapsulated by a seal material, and a height of each of the protruding electrodes from the second surface is larger than a height of a sealed portion of the first semiconductor element from the electrode pads.

According to the above-mentioned invention, the through holes are formed in the redistribution substrate such as an interposer so that the back side of the electrode pads are exposed on the bottom of the respective through holes and the protruding electrodes are formed on the respective electrode pads though the through holes. Additionally, since each of the protruding electrodes is higher than the sealed portion of the first semiconductor element, when two semiconductor devices are stacked one on another, the sealed portion of the lower semiconductor device can be accommodated in a space between the redistribution substrates of the upper and lower semiconductor devices while the protruding electrodes of the upper semiconductor device are bonded to the electrode pads of the lower semiconductor device. That is, the distance between the upper semiconductor device and the lower semiconductor device can be defined only by the protruding electrodes of the upper semiconductor device being bonded to the electrode pads of the lower semiconductor device. Thus, the stacked structure of the semiconductor devices can be achieved in a simple structure. Additionally, the electrode pads can be freely positioned around the first semiconductor element on the first surface of the redistribution substrate by forming wiring patterns on the first surface under the first semiconductor element.

Additionally, there is provided according to another aspect of the present invention a semiconductor device comprising: first and second semiconductor elements; a redistribution substrate having a first surface and a second surface opposite to the first surface, the first semiconductor element mounted on the first surface and the second semiconductor element mounted on the second surface; a plurality of first electrode pads arranged on the first surface of the redistribution substrate, the first electrode pads being electrically connected to the first semiconductor element; a plurality of second electrode pads arranged on the second surface of the redistribution substrate, the second electrode pads being electrically connected to the second semiconductor element; a plurality of via holes electrically connecting the first electrode pads to the respective second electrode pads; a plurality of protruding electrodes provided to the first electrode pads, wherein the first and second semiconductor elements are individually encapsulated by a seal material, and a height of each of the protruding electrodes from the first surface is larger than a height of a sealed portion of the first semiconductor element.

According to the above-mentioned invention, the semiconductor elements are mounted on both sides of the redistribution substrate, and also the electrode pads are formed on both sides of the redistribution substrate. The protruding electrodes are formed on the electrode pads on one side of the redistribution substrate, and the electrode pads on one side of the redistribution substrate are electrically connected to the respective electrode pads on the opposite side of the redistribution substrate. Accordingly, a semiconductor device having protruding electrodes each of which is higher than the sealed portion formed on the side where the electrode pads are not provided can be stacked on the semiconductor device according to the present invention from the side where the protruding electrodes are not provided. Thereby, a stacked structure of the semiconductor devices can be achieved in a simple structure.

Additionally, there is provided according to another aspect of the present invention a method for manufacturing a semiconductor device comprising first and second semiconductor elements and a redistribution substrate having a first surface and a second surface opposite to the first surface, the first semiconductor element mounted on the first surface and the second semiconductor element mounted on the second surface, the method comprising the steps of: mounting the first semiconductor device on the first surface of the redistribution substrate; placing the redistribution substrate on a jig after turning over the redistribution substrate, the jig having a depression in which the first semiconductor element is accommodated, the jig also having a buffer member supporting the first semiconductor element in the depression; and mounting the second semiconductor element on the second surface of the redistribution substrate.

According to the above-mentioned invention, when mounting semiconductor elements on both sides of the redistribution substrate after one of the semiconductor elements is mounted on one side of the redistribution substrate, the other one of the semiconductor elements can be mounted while the one of the semiconductor elements is supported from underneath. Accordingly, the semiconductor elements can be positively mounted on both sides of the redistribution substrate.

Additionally, there is provided according to another aspect of the present invention a method for stacking a plurality of semiconductor devices each of which comprises: a redistribution substrate; a semiconductor element mounted on the redistribution substrate and protected by a package; a plurality of protruding electrodes arranged on the redistribution substrate; and a plurality of electrode pads provided on a surface opposite to a surface on which the protruding electrodes are provided so that the electrode pads are opposite to the respective protruding electrodes, wherein the semiconductor devices are stacked by connecting the protruding electrodes of one of the semiconductor devices to the electrode pads of one of the semiconductor devices located on an upper side, the method comprising the steps of: placing each semiconductor device so that the protruding electrodes face upward; and applying flux to the protruding electrodes by using a transfer head carrying the flux in a shape corresponding to an arrangement of the protruding electrodes so that the flux is applied only to the protruding electrodes.

According to the above-mentioned invention, the flux is applied to the protruding electrodes by the transfer head. Since the transfer head has the flux applying part having a configuration corresponding to an area where the protruding electrode are arranged, an appropriate amount of the flux can be applied only to the protruding electrodes. Thereby, the adjacent protruding electrodes and the adjacent electrode pads can be prevented from being short circuited when a reflow process is performed.

Additionally, there is provided according to another aspect of the present invention a method for stacking a plurality of semiconductor devices each of which comprises: a redistribution substrate; a semiconductor element mounted on the redistribution substrate and protected by a package; a plurality of protruding electrodes on the redistribution substrate; and a plurality of electrode pads provided on a surface opposite to a surface on which the protruding electrodes are provided so that the electrode pads are opposite to the respective protruding electrodes, wherein the semiconductor devices are stacked by connecting the protruding electrodes of one of the semiconductor devices to the electrode pads of one of the semiconductor devices located on an upper side, the method comprising the steps of: conveying each semiconductor device to a flux applying position at which a flux applying member is located in a state in which the protruding electrodes of the semiconductor device face downward, the flux applying member having a flux filling part corresponding to an area in which the protruding electrodes are arranged; and applying flux to the protruding electrodes by putting the protruding electrodes into the flux filled in the flux filling part.

According to the above-mentioned invention, the protruding electrodes are put into the flux filled in the flux filling part having a configuration corresponding to an area where the protruding electrodes are arranged. Accordingly, an appropriate amount of the flux can be applied only to the protruding electrodes. Thus, the adjacent protruding electrodes and the adjacent electrode pads can be prevented from being short circuited when a reflow process is performed. Additionally, the semiconductor device is stored, after being manufactured, in a state in which the protruding electrodes face downward, there is no need to turn over the semiconductor device, thereby simplifying the process of applying the flux to the protruding electrodes.

Other objects, features and advantages of the present invention will become more apparent from the following detailed description when read in conjunction with the accompanying drawings.

BRIEF DESCRIPTION OF THE DRAWINGS

FIG. 31 is an illustration of stacked structures in which two semiconductor chips are stacked;

FIG. 33 is an illustration of stacked structures in which four semiconductor chips are stacked;

DETAILED DESCRIPTION OF THE PREFERRED EMBODIMENTS

Figure 1:
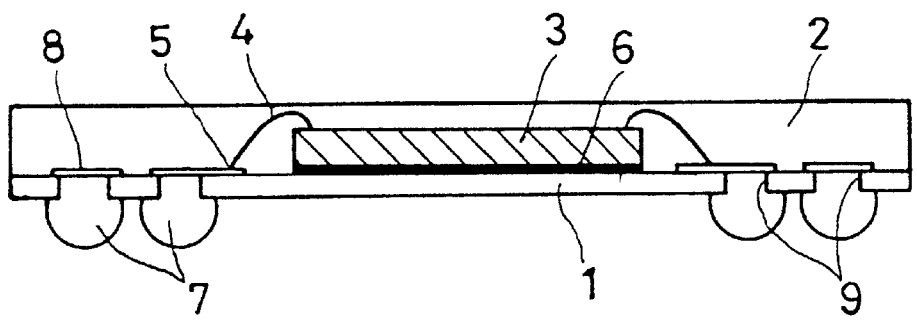
FIG. 1 is a cross-sectional view of a conventional fan-out type semiconductor device.
Figure 2:
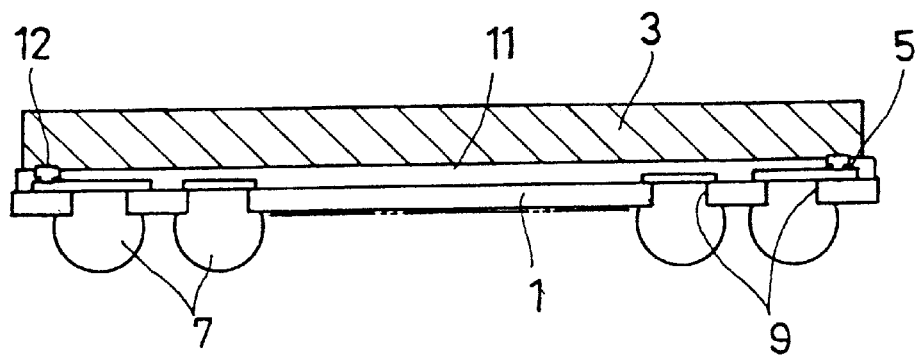
FIG. 2 is a cross-sectional view of a CSP type semiconductor device in which a semiconductor chip is mounted by a flip-chip mounting method.
Figure 3:
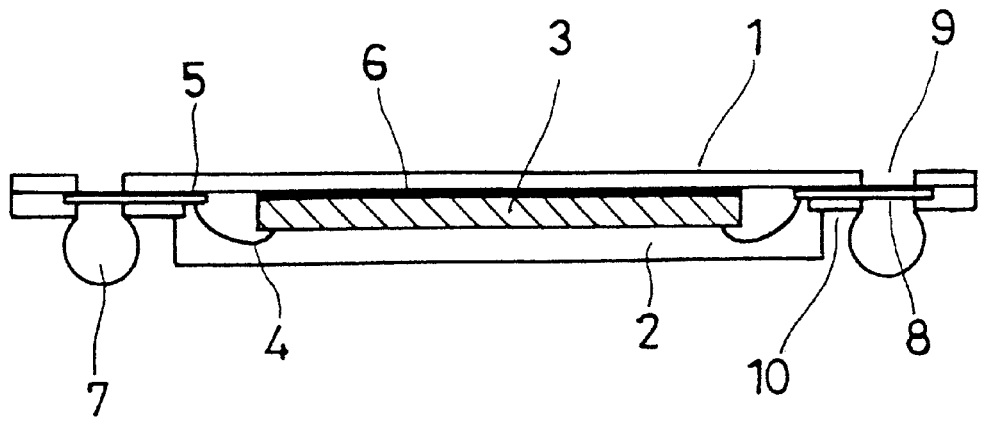
FIG. 3 is a cross-sectional view of a semiconductor device according to a first embodiment of the present invention.

A description will now be given, with reference to FIG. 3, of a first embodiment of the present invention. FIG. 3 is a cross-sectional view of a semiconductor device 40 according to the first embodiment of the present invention. In FIG. 3, parts that are the same as the parts shown in FIG. 1 are given the same reference numerals, and descriptions thereof will be omitted. The semiconductor device 40 is a fan-out type semiconductor chip in which a semiconductor chip 3 is wire bonded.

In the semiconductor device 40 shown in FIG. 3, the semiconductor chip 3 is mounted on the wiring surface of the interposer 1, which is a oneside wiring substrate. The interposer 1 is formed of an organic material substrate such as a polyamide tap substrate, a glass-epoxy substrate or a polycarbonate substrate. The semiconductor chip 3 is fixed to the interposer 1 by the die bonding material 11. The semiconductor chip 3 is wire bonded by the Au wires 4 to the bonding pads 5 formed on the interposer 1. That is, semiconductor chip 3 is electrically connected to the bonding pads 5 by the Au wires 4. The bonding pads 5 are connected to the ball pads 8 by wiring patterns. The surface of the ball pads 8 are covered by a solder resist 10 except for portions to be provided with the solder balls 7. The solder balls 7 are provided to the ball pads 8 on the side of the surface on which the semiconductor chip 3 in mounted.

The through holes (VIA holes) 9 are formed in the interposer so that the through holes 9 extends trough the interposer 1 from the surface opposite to the surface on which the semiconductor chip 3 is mounted to the back surfaces of the ball pads 8. Accordingly,the back surfaces of the ball pads 8 are exposed within the respective through holes 9. In order to stack the semiconductor device 40 one on another as mentioned later, the size of each of the through holes 9 is set so that an exposed area of each of the ball pad 8 is sufficient to connect the solder ball 7. As mentioned above, While the semiconductor chip 3 and the bonding pads 5 are encapsulated by the seal resin 2, the ball pads 8 covered by the solder resist 10 except for the ball mounting areas are not encapsulated. Accordingly, the solder balls 7 can be provided onto the ball mounting areas of the ball pads 8. That is, the solder balls 7 are arranged around the semiconductor chip 3 on the surface of the interposer on which the semiconductor chip 3 is mounted.

The semiconductor chip 3 is a type of a small thickness so that the height of the seal resin 2 from the ball pads 8 is smaller than the height of the solder balls from the ball pads 8. That is, the solder balls 7 are set higher than the seal resin 2 so that a semiconductor device having the same structure can be easily mounted on the semiconductor device 40. In order to reduce the height of the seal resin 2, it is effective to use a liquefied resin for the encapsulation. Additionally, use of a vacuum printing apparatus may also effective to achieve a lower and uniform height of the seal resin 2.

Figure 4:
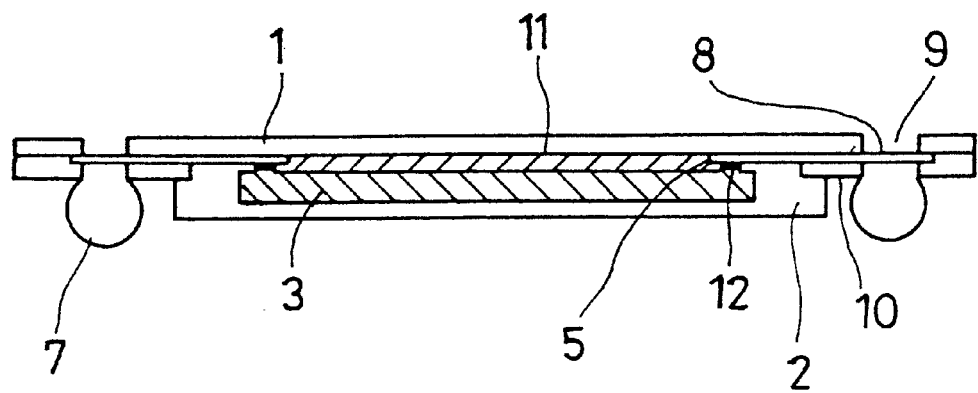
FIG. 4 is a cross-sectional view of a semiconductor device according to the first embodiment of the present invention in which a semiconductor chip is mounted by a flip chip mounting method.

FIG. 4 is a cross-sectional view of a semiconductor device according to the first embodiment of the present invention in which the semiconductor chip 3 is mounted by a flip chip mounting method. In FIG. 4, parts that are the same as the parts shown in FIG. 3 are given the same reference numerals, and descriptions thereof will be omitted.

As shown in FIG. 4, the height of the seal resin 2 can be further reduced than that shown in FIG. 3 by mounting the semiconductor chip 3 by a flip chip mounting method. That is, electric connection between the semiconductor chip 3 and the interposer 1 is achieved by protruding electrodes 12 provided to the semiconductor chip 3 instead of the Au wires 4 so as to reduce the height of the seal resin 2. The protruding electrodes 12 can be Au bumps or solder bumps.

The under fill material 11 is filled between the semiconductor chip 3 and the interposer 1 so as to reinforce the connection between the protruding electrodes 12 and the bonding pads 5. If the under fill material 11 is applied after the formation of the solder balls 7, the under fill material 11 can be supplied to an area where the solder balls 7 are connected to the ball pads 8, which results in reinforcing the connection of the solder balls 7. Thereby, a reliable secondary mounting in which the semiconductor device is mounted to a mounting substrate can be achieved.

The semiconductor device shown in FIG. 4 is a so-called over-mold type in which the entire semiconductor chip 3 is encapsulated by the seal resin 2. However, when the flip chip mounting method is used, the encapsulation by the seal resin 2 can be omitted. Accordingly, the height which must be smaller than the height of the solder balls 7 can be further reduced. In this case, the height corresponds to the height of the semiconductor chip 3.

The semiconductor devices shown in FIGS. 3 and 4 can be manufactured at a low cost by using the interposer having wiring patterns on the single side thereof. Additionally, there is no need to apply plating to an inner surface of each of the through holes 9, and fine wiring can be achieved.

Figure 5:
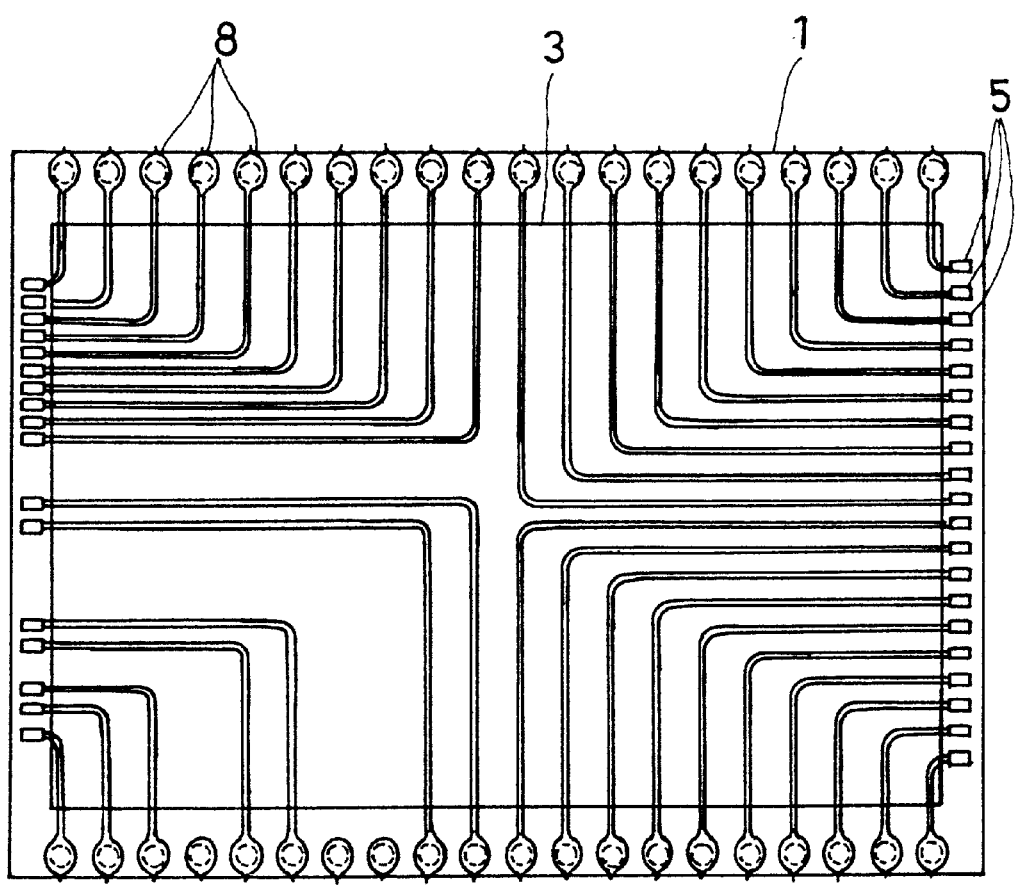
FIG. 5 is a plan view of an interposer shown in FIG. 3 for explaining positional relationship between bonding pads and ball pads.

FIG. 5 is a plan view of the interposer shown in FIG. 3 for explaining positional relationship between the bonding pads 5 and the ball pads 8. The interposer 1 used for the semiconductor devices according to the present embodiment can be provided with wiring patterns in an area facing the semiconductor chip 3. Accordingly, the positional relationship between the bonding pads 5 and the ball pads 8 can be freely set, resulting in an effective arrangement of the bonding pads 5 and the ball pads 8 in a small area.

It should be noted that, although the semiconductor chip 3 is connected to the interposer 1 by the wire bonding method or the flip chip bonding method in the above-mentioned embodiment, the interposer 1 may be formed by a tape substrate so as to connect the semiconductor chip 3 to the interposer 1 by a tape automated bonding (TAB) method.

Figure 6:
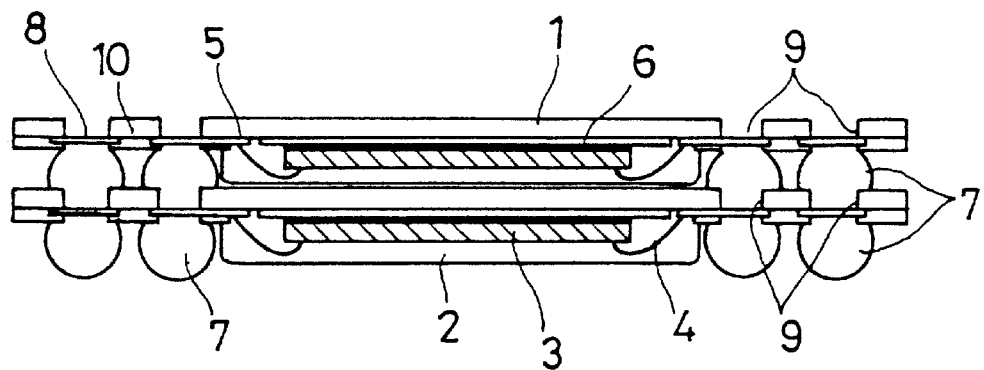
FIG. 6 is a cross-sectional view of a stacked structure in which two semiconductor devices are stacked each of which has a semiconductor chip connected to an interposer by the wire bonding method as shown in FIG. 3.
Figure 7:
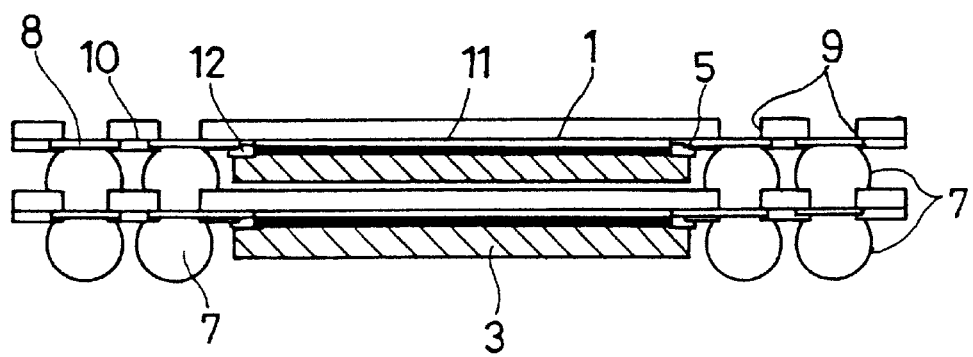
FIG. 7 is a cross-sectional view of a stacked structure in which two semiconductor devices are stacked each of which has a semiconductor chip connected to an interposer by the flip chip bonding method as shown in FIG. 4.

A description will now be given, with reference to FIGS. 6 and 7, of a structure in.which a plurality of semiconductor devices are connected in a stacked state. FIG. 6 is a cross-sectional view of a stacked structure of semiconductor devices in which two semiconductor devices are stacked each of which has a semiconductor chip connected to the interposer by the wire bonding method as shown in FIG. 3. FIG. 7 is a cross-sectional view of a stacked structure of semiconductor devices in which two semiconductor devices are stacked each of which has a semiconductor chip connected to the interposer by the flip chip bonding method as shown in FIG. 4. In FIGS. 6 and 7, parts that are the same as the parts shown in FIGS. 3 and 4 are given the same reference numerals, and descriptions thereof will be omitted.

As shown in FIGS. 6 and 7, the solder balls 7 provided in the upper semiconductor device are connected to the ball pads 8 of the lower semiconductor device via the through holes 9 provided in the lower semiconductor device. Since the height of the solder balls 7 is larger than the height of the seal resin 2, the distance between the interposers 1 of the upper semiconductor device and the lower semiconductor device can be maintained larger than the height of the seal resin 2 by the solder balls 7. Accordingly, the semiconductor chip 3 of the upper semiconductor device is accommodated in a space formed between the interposers 1 of the lower and-upper semiconductor devices.

The above-mentioned stacked structure of the semiconductor devices can be achieved by merely connecting the solder balls 7 of the upper semiconductor device to the ball pads 8 of the lower semiconductor device by placing the upper semiconductor device to the lower semiconductor device. Accordingly, the stacked structure can be achieved by a simple operation. Additionally, since the solder balls 7 of the upper semiconductor device are positioned within the respective through holes 9 formed in the interposer 1 of the lower semiconductor device, the upper semiconductor device is automatically positioned relative to the lower semiconductor device.

Figure 8:
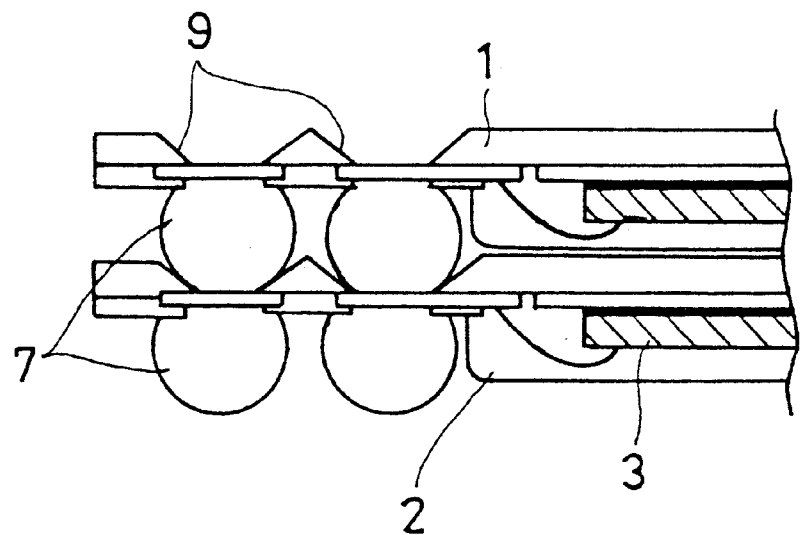
FIG. 8 is a cross-sectional view of a part of an example of a part of a stacked structure of the semiconductor devices shown in FIG. 4.

FIG. 8 is a cross-sectional view of a semiconductor device that is a variation of the semiconductor device according to the first embodiment of the present invention. In FIG. 8, parts that are the same as the parts shown in FIG. 6 are given the same reference numerals, and descriptions thereof will be omitted.

In the variation shown in FIG. 8, each of the through holes 9 is formed in a conical shape so that the opening area is larger than-the bottom. Thus, the solder balls 7 are easily lead to the center of the through holes 9, resulting in easy positioning of the upper semiconductor device relative to the lower semiconductor device. It should be noted that the shape of each of the through holes 9 is not limited to the conical shape, and the each of the through holes 9 may be tapered or an open end of each of the though holes 9 may be chamfered.

In order to prevent the solder balls 7 from being removed due to solder reflow when the semiconductor devices are stacked or secondary mounting is performed, it is preferred that the size of the land on the mounting substrate be less than 1.5 times the size of the through hole 9. More preferably, the size of the land is equal to the size of the though hole 9. In such a case, the connecting areas of the solder ball are equalized, thereby preventing the solder being attracted to one side or preventing the stress being generated in the solder after mounting. Additionally, if a solder ball having a high melting point is used for the solder balls 7 of the upper semiconductor device, the solder balls 7 in the stacked structure are prevented from being remelted when the stacked structure is mounted to a mounting board. Thus, a reliable secondary mounting can be achieved.

It should be noted that the shape of the though hole 9 and the material of the solder ball 7 can be applied to other embodiments described below.

Figure 9:
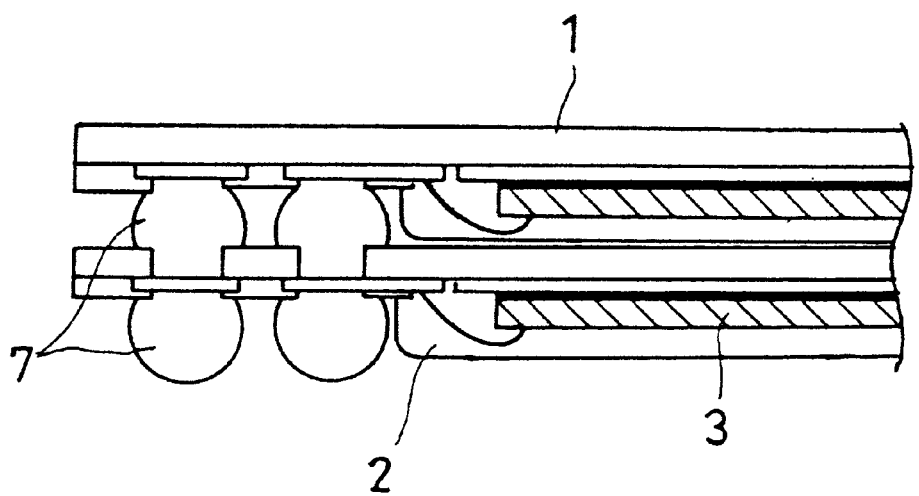
FIG. 9 is a cross-sectional view of an example of a part of a stacked structure of the semiconductor devices shown in FIG. 4.

In the above-mentioned stacked structure, the solder balls 7 are not connected to the interposer 1 of the uppermost semiconductor device. Accordingly, there is no need to provide the through holes 9 in the interposer 1 of the uppermost semiconductor device as shown in FIG. 9, which may reduce the manufacturing cost of the semiconductor devices. On the other hand, is the interposer 1 of the uppermost semiconductor device has through holes 9, an electrical connection can be made with the semiconductor devices though the through holes 9, thereby a semiconductor test such as a conductance test can be easily performed.

Figure 10:
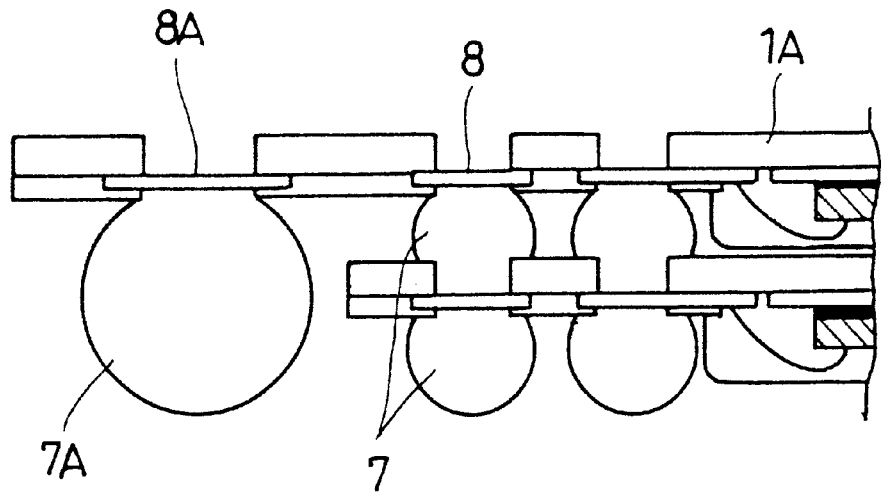
FIG. 10 is a cross-sectional view of a part of a stacked structure of the semiconductor devices according to the present embodiment in which the number of electrodes of an upper semiconductor device is larger than the number of electrodes of a lower semiconductor device.

FIG. 10 is a cross-sectional view of a part of a stacked structure of the semiconductor devices according to the present embodiment in which the number of electrodes of the upper semiconductor device is larger than the number of electrodes of the lower semiconductor device. In FIG. 10, parts that are the same as the parts shown in FIG. 6 are given the same reference numerals, and descriptions thereof will be omitted.

In FIG. 10, since the number of electrodes of the upper semiconductor device is larger than the number of electrodes of the lower semiconductor device, an interposer 1A of the upper semiconductor device is larger than the interposer 1 of the lower semiconductor device so as to provide a ball pad 8A to the elongated part of the interposer 1A in addition to the ball pads 8. A solder ball 7A is provided to the ball pad 8A arranged on the periphery of the interposer 1A of the upper semiconductor device. The solder ball 7A is not connected to the lower semiconductor device, and is larger than the solder ball 7. That is, the height of the solder ball 7A is larger than the height of the solder balls 7 so that the lower end of the solder ball 7A reaches the lower end of each of the solder balls 7. Accordingly, the upper semiconductor device can be directly connected to a mounting board such as a motherboard through the solder ball 7A without routing the lower semiconductor device. According to the above-mentioned stacked structure of the semiconductor devices, the semiconductor chip provided in the upper semiconductor device can be a different size than the semiconductor chip provided in the lower semiconductor device. Thus, various semiconductor devices can be provided in the stacked structure according to the present invention.

Figure 11:
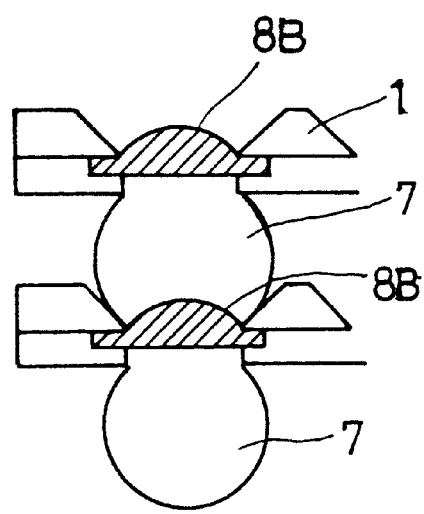
FIG. 11 is a cross sectional view of a ball pad having a convex upper surface.

FIG. 11 is a cross-sectional view of an example of a ball pads in the though hole in the semiconductor devices according to the first embodiment of the present invention. The ball pad 8B shown in FIG. 11 has a convex upper surface to which the solder ball 7 of the upper semiconductor device is connected. By forming the ball pad in the convex shape, the contact area between the ball pad 8B and the solder ball 7 is increased, resulting in a reliable connection of the solder ball 7 to the ball pad 8B.

It should be noted that, in the above-mentioned stacked structure of the semiconductor devices according to the present embodiment, the semiconductor chips provided in the semiconductor devices in the stacked structure may be the same kind of chip or different kinds of chips.

Additionally, although two semiconductor devices are stacked in the above-mentioned embodiment, more than three semiconductor chips can be stacked in the same manner.

Additionally, the variations described above can be applied to other embodiments described below.

Figure 12:
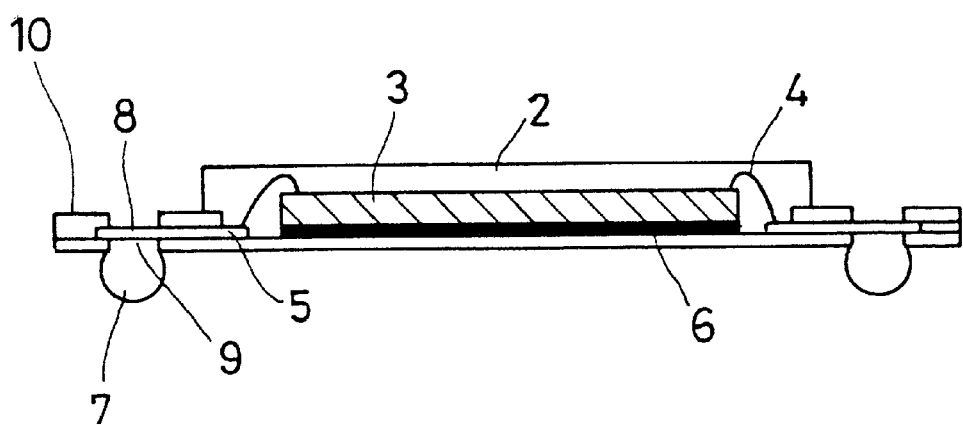
FIG. 12 a cross-sectional view of a semiconductor device according to the second embodiment of the present invention in which a semiconductor chip is mounted by a wire bonding method.
Figure 13:
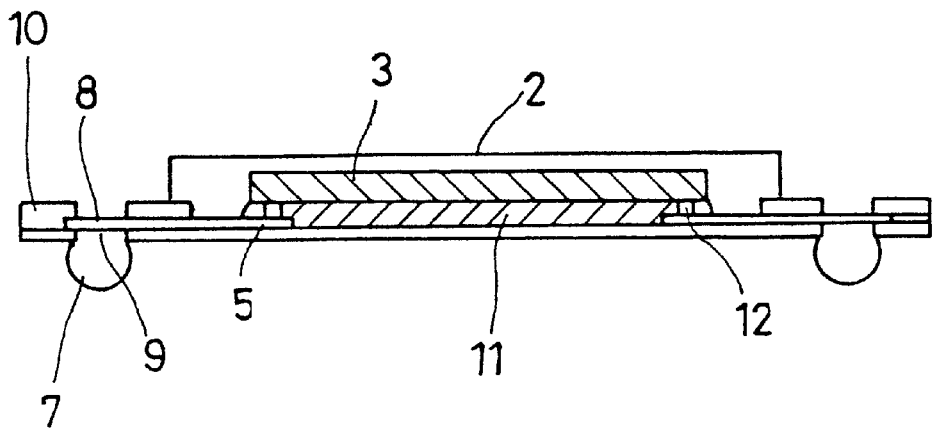
FIG. 13 is a cross-sectional view of a semiconductor device according to the second embodiment of the present invention in which a semiconductor chip is mounted by a flip chip mounting method.

A description will now be given, with reference to FIGS. 12 and 13, of a second embodiment of the present invention. FIG. 12 is a cross-sectional view of a semiconductor device according to the second embodiment of the present invention in which a semiconductor chip is mounted by a wire bonding method. FIG. 13 is a cross-sectional view of a semiconductor device according to the second embodiment of the present invention in which a semiconductor chip is mounted by a flip chip mounting method. In FIGS. 12 and 13, parts that are the same as the parts shown in FIGS. 3 and 4 are given the same reference numerals, and descriptions thereof will be omitted. The pars of the semiconductor device according to the second embodiment of the present invention are basically the same as the parts of the semiconductor device according to the above-mentioned first embodiment, and, thus, descriptions will be give of only the differences therebetween.

In the semiconductor device according to the first embodiment of the present invention, the solder balls 7 are provided on the side of the semiconductor chip 3, that is, on the side of the wiring patterns. Additionally, the height of the seal resin is smaller than the solder balls 7. Accordingly, the semiconductor chip 3 and the solder balls are provided on the same side of the interposer 1, and the through holes 9 are provided on the opposite side of the interposer 1.

On the other hand, in the semiconductor device according to the second embodiment of the present invention, the solder balls 7 are provided on the side opposite to the side of the interposer 1 on which the semiconductor chip 3 is mounted. That is, the solder balls 7 are formed on the ball pads 8 exposed in the through holes 9. Accordingly, the solder balls 7 protrude from the surface opposite to the surface on which the semiconductor chip 3 is mounted.

In the above-mentioned structure, the height of the seal resin 2 is smaller than the height of the solder balls 7. That is, since the height of the solder balls 7 is larger than the height of the seal resin 2, the seal resin 2 can be accommodated in a space between the interposers of the upper and lower semiconductor devices when the semiconductor devices according to the present embodiment are stacked as described later.

It should be noted that, although the semiconductor chip 3 in the present embodiment is connected to the interposer 1 by the wire bonding method or the flip chip bonding method in the above-mentioned embodiment, the interposer 1 may be formed by a tape substrate so as to connect the semiconductor chip 3 to the interposer 1 by a tape automated.bonding (TAB) method.

Figure 14:
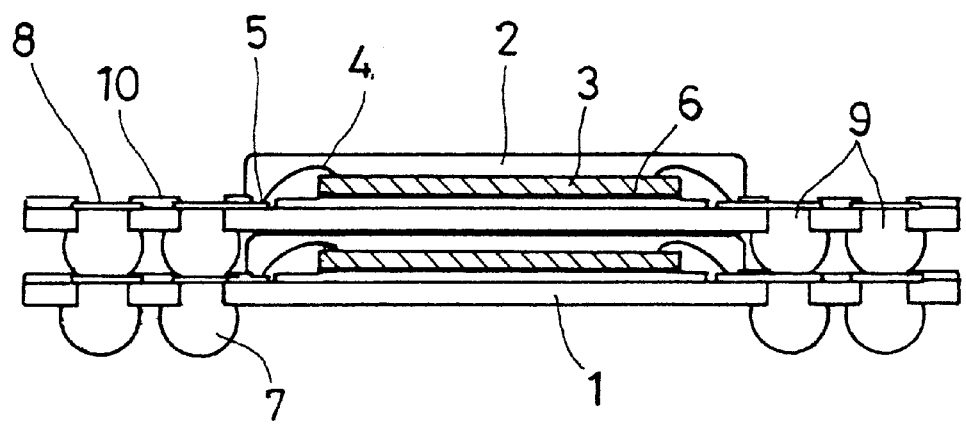
FIG. 14 is a cross-sectional view of a stacked structure in which two semiconductor devices are stacked each of which has a semiconductor chip connected to the interposer by the wire bonding method as shown in FIG. 12.
Figure 15:
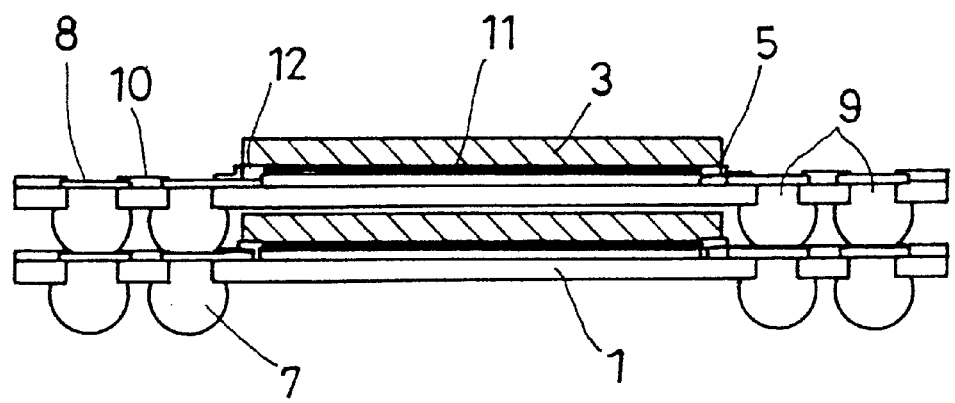
FIG. 15 is a cross-sectional view of a stacked structure in which two semiconductor devices are stacked each of which has a semiconductor chip connected to the interposer by the flip chip bonding method as shown in FIG. 13.

A description will now be given, with reference to FIGS. 14 and 15, of a structure in which a plurality of semiconductor devices according to the second embodiment are connected in a stacked state. FIG. 14 is a cross-sectional view of a stacked structure in which two semiconductor devices are stacked each of which has a semiconductor chip connected to the interposer by the wire bonding method as shown in FIG. 12. FIG. 15 is a cross-sectional view of a stacked structure in which two semiconductor devices are stacked each of which has a semiconductor chip connected to the interposer by the flip chip bonding method as shown in FIG. 13. In FIGS. 14 and 15, parts that are the same as the parts shown in FIGS. 12 and 13 are given the same reference numerals, and descriptions thereof will be omitted.

As shown in FIGS. 14 and 15, the solder balls 7 provided in the upper semiconductor device are connected to the ball pads 8 of the lower semiconductor device via the through holes 9 provided in the upper semiconductor device. Since the height of the solder balls 7 is larger than the height of the seal resin 2, the distance between the interposers 1 of the upper semiconductor device and the lower semiconductor device can be maintained larger than the height of the seal resin 2 by the solder balls 7. Accordingly, the semiconductor chip 3 of the lower semiconductor device is accommodated in a space formed between the interposers 1 of the lower and upper semiconductor devices.

The above-mentioned stacked structure of the semiconductor devices can be achieved by merely connecting the solder balls 7 of the upper semiconductor device to the ball pads 8 of the lower semiconductor device by placing the upper semiconductor device to the lower semiconductor device. Accordingly, the stacked structure of the semiconductor devices can be achieved by a simple operation.

It should be noted that, in the above-mentioned stacked structure of the semiconductor devices according to the present embodiment, the semiconductor chips provided in the semiconductor devices in the stacked structure may be the same kind of chip or different kinds of chips. Additionally, although two semiconductor devices are stacked in the above-mentioned embodiment, more than three semiconductor chips can be stacked in the same manner.

Figure 16:
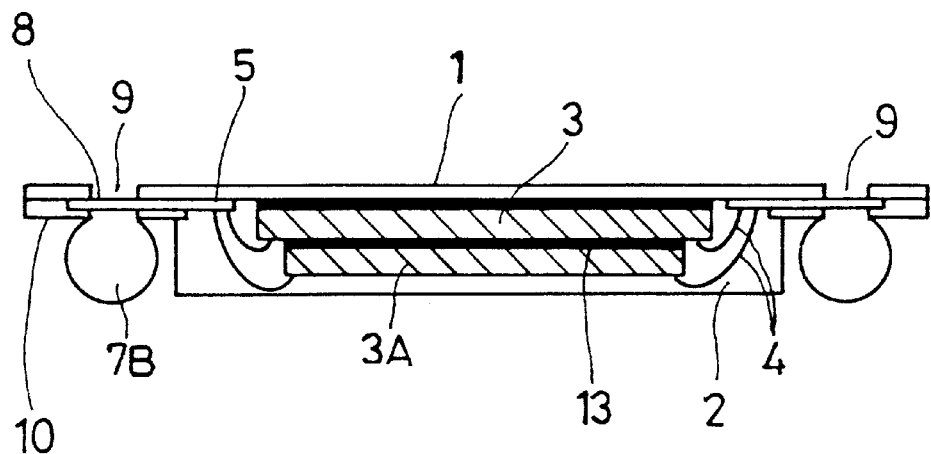
FIG. 16 is a cross-sectional view of a semiconductor device according to the third embodiment of the present invention in which two semiconductor chips are provided in a stacked relationship and the lower semiconductor chip is connected by a wire bonding method.
Figure 17:
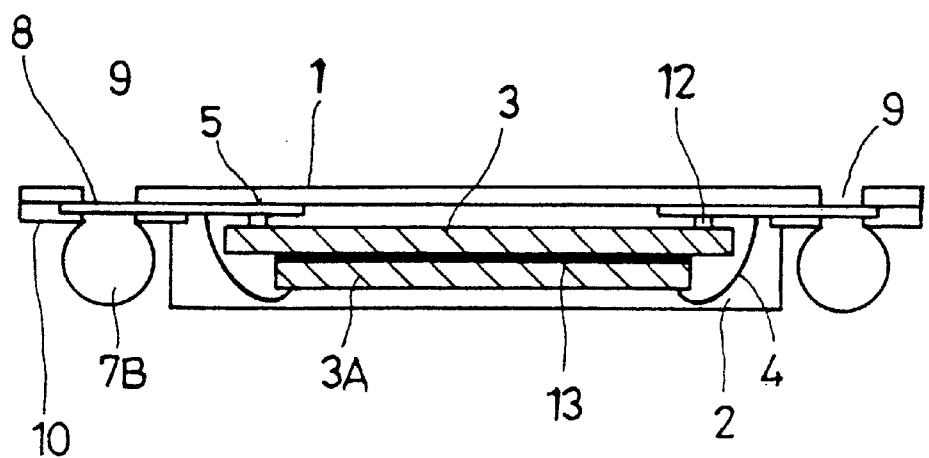
FIG. 17 is a cross-sectional view of a semiconductor device according to the third embodiment of the present invention in which two semiconductor chips are provided in a stacked relationship and the lower semiconductor chip is connected by a flip chip bonding method.

A description will now be given, with reference to FIGS. 16 and 17, of a third embodiment of the present invention. FIG. 16 is a cross-sectional view of a semiconductor device according to the third embodiment of the present invention in which two semiconductor chips are provided in a stacked relationship and the lower semiconductor chip is connected by a wire bonding method. FIG. 17 is a cross-sectional view of a semiconductor device according to the third embodiment of the present invention in which two semiconductor chips are provided in a stacked relationship and the lower semiconductor chip is connected by a flip chip bonding method. In FIGS. 16 and 17, parts that are the same as the parts shown in FIGS. 3 and 4 are given the same reference numerals, and descriptions thereof will be omitted.

The semiconductor device according to the third embodiment of the present invention has the same structure as the semiconductor device according to the first embodiment of the present invention except for an additional semiconductor chip 3A mounted on the semiconductor chip 3. The semiconductor chip 3A is encapsulated by the seal resin 2 together with the semiconductor chip 3.

In FIG. 16, the semiconductor chip 3A smaller than the semiconductor chip 3 is stacked on the semiconductor chip 3 via a buffer material 13 interposed therebetween. Both the semiconductor chip 3 and the semiconductor chip 3A are connected to the bonding pads 5 of the interposer 1 by the Au wires 4, and are encapsulated by the seal resin 2. Similar to the semiconductor device according to the first embodiment of the present invention, the height of the seal resin 2 is set to be smaller than the height of the solder balls 7B. Accordingly, a plurality of semiconductor devices according to the present embodiment can also be connected in a stacked relationship.

In the semiconductor device shown in FIG. 17, the semiconductor chip 3 is connected to the interposer 1 by a flip chip bonding method. Other structures are the same as the semiconductor device shown in FIG. 16.

Although not shown in the figures, the semiconductor chip 3 may be connected by a TAB method. Additionally, two semiconductor chips are stacked in the semiconductor devices shown in FIGS. 16 and 17, more than three semiconductor chips may be stacked and encapsulated by the seal resin 2 if the height of the solder ball 7B can be larger than the seal resin 2.

Figure 18:
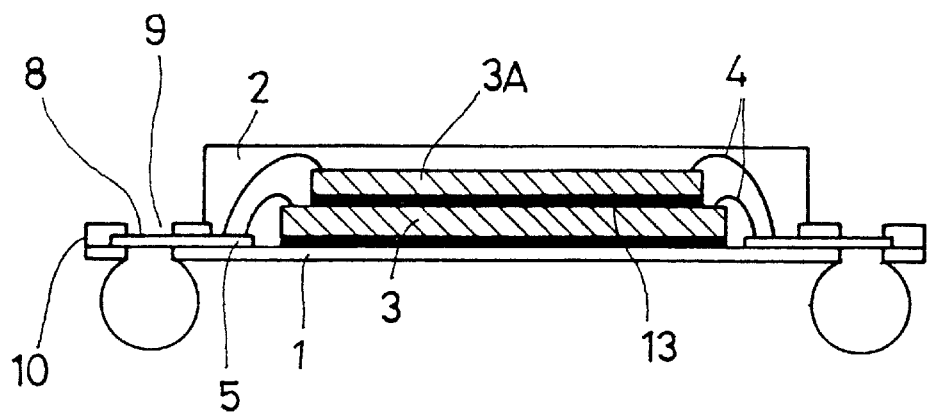
FIG. 18 is a cross-sectional view of a semiconductor device according to a fourth embodiment of the present invention.

A description will now be given, with reference to FIG. 18, of a fourth embodiment of the present invention. FIG. 18 is a cross-sectional view of a semiconductor device according to the fourth embodiment of the present invention. In FIG. 18, parts that are the same as the parts shown in FIG. 12 are given the same reference numerals, and descriptions thereof will be omitted.

The semiconductor device according to the fourth embodiment of the present invention has the same structure as the semiconductor device according to the second embodiment of the present invention except for an additional semiconductor chip 3A mounted on the semiconductor chip 3. The semiconductor chip 3A is encapsulated by the seal resin 2 together with the semiconductor chip 3.

In FIG. 18, the semiconductor chip 3A smaller than the semiconductor chip 3 is stacked on the semiconductor chip 3 via a buffer material 13 interposed therebetween. Both the semiconductor chip 3 and the semiconductor chip 3A are connected to the bonding pads 5 of the interposer 1 by the Au wires 4, and are encapsulated by the seal resin 2. Similar to the semiconductor device according to the second embodiment of the present invention, the height of the seal resin 2 is set to be smaller than the height of the solder balls 7B. Accordingly, a plurality of semiconductor devices according to the present embodiment can also be connected in a stacked relationship.

In the semiconductor device shown in FIG. 18, the semiconductor chip 3 is connected to the interposer 1 by a wire bonding method. However, the semiconductor chip 3 may be connected to the interposer 1 by a flip chip bonding method. Alternatively, the semiconductor chip 3 may be connected by a TAB method. Additionally, two semiconductor chips are stacked in the semiconductor devices shown in FIG. 18, more than three semiconductor chips may be stacked and encapsulated by the seal resin 2 if the height of the solder ball 7B can be larger than the seal resin 2.

Figure 19:
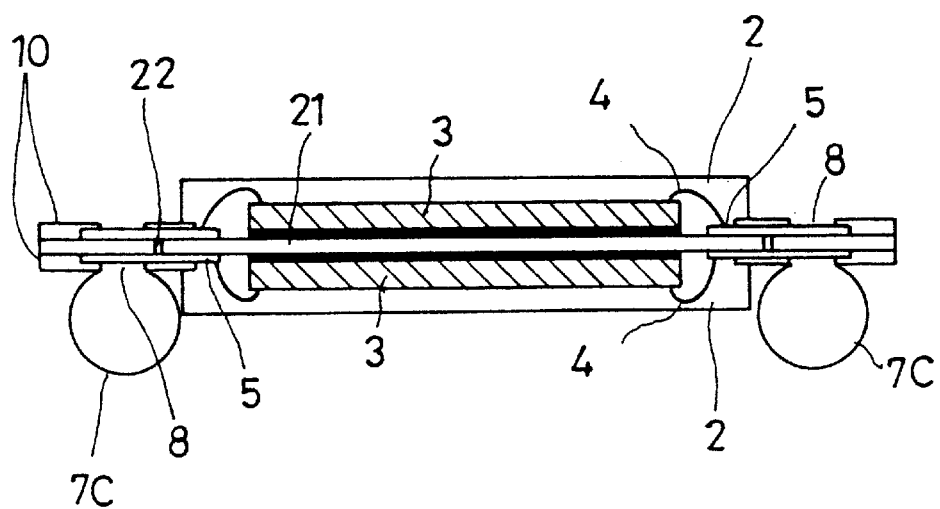
FIG. 19 is a cross-sectional view of a semiconductor device according to a fifth embodiment of the present invention.

A description will now be given, with reference to FIG. 19, of a fifth embodiment of the present invention. FIG. 19 is a cross-sectional view of a semiconductor device according to the fifth embodiment of the present invention. In FIG. 19, parts that are the same as the parts shown in FIG. 3 are given the same reference numerals, and descriptions thereof will be omitted.

In this embodiment, an interposer 21 is used. The interposer 21 has wining patterns on both sides. Accordingly, the bonding pads 5 and the ball pads 8 are provided on each side of the interposer 21, and the semiconductor chip 3 is mounted on each side of the interposer 21 and is encapsulated by the seal resin 2. The ball pads 8 or the bonding pads 5 formed on one side of the interposer 21 are electrically connected to the ball pads 8 or the bonding pads 5 formed on the opposite side of the interposer 21 via VIA holes 22. The VIA holes extend through the interposer 21, and the inner wall are of the VIA holes 22 are plated so as to electrically connect the ball pads 8 or the bonding pads 5 formed on both sides of the interposer 21. Solder balls 7C are provided on the ball pads formed on one of the sides of the interposer 21.

The height of the solder balls 7C is more than twice the height of the seal resin 2 so that a plurality of semiconductor chips can be stacked. That is, when the semiconductor devices according to the present embodiment are connected in a stacked state, the solder balls 7C of the upper semiconductor device are connected to the ball pads 8 of the lower semiconductor device. The seal resin 2 of the upper semiconductor device and the seal resin 2 of the lower semiconductor device are situated between the interposer 21 of the upper semiconductor device and the interposer 21 of the lower semiconductor device. Accordingly, the height of the solder balls 7C must be twice the height of the seal resin 2.

The lowermost semiconductor device among a plurality of semiconductor devices which are stacked one on another is not necessarily provided with the solder balls 7C having a large size. That is, the lowermost semiconductor device can be provided with the solder balls 7 having a height larger than the height of the seal resin 2 of the lower semiconductor device.

It should be noted that, similar to the above-mentioned embodiments, the semiconductor chip of the semiconductor device according to the present embodiment may be connected to the interposer by a flip chip bonding method or a TAB method.

Figure 20:
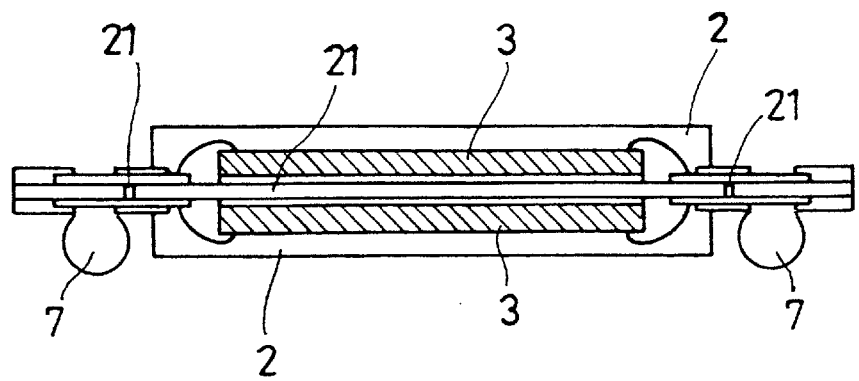
FIG. 20 is a cross-sectional view of a variation of the semiconductor device according to the fifth embodiment of the present invention.
Figures 21A, 21B:
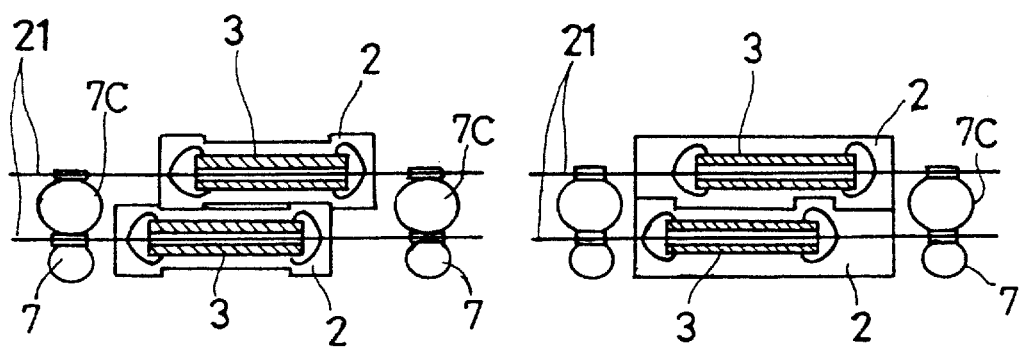
FIGS. 21A and 21B are illustrations showing the stacked structures of variations of the semiconductor devices shown in FIGS. 19 and 20.

FIGS. 21A and 21B are illustrations showing the stacked structures of variations of the semiconductor devices shown in FIGS. 19 and 20. In the variations of the semiconductor device, portions other than the portion in which the bonding wires (Au wires) 4 are encapsulated are set to be lower than the seal resin 2. Additionally, the position of the semiconductor chip 3 of the upper semiconductor device is offset from the position of the semiconductor chip 3 of the lower semiconductor device so that the portions of the encapsulated bonding wire of the upper and lower semiconductor devices do not overlap with each other. That is, the height of the stacked structure is reduced by reducing the distance between the interposer of the upper and lower semiconductor devices by offsetting the encapsulated bonding wire portions since the portions of the bonding wire are the highest portion in the encapsulated potions. It should be noted that positioning of the semiconductor devices relative to each other can be performed by fitting the encapsulated bonding wire portion of one semiconductor device to the encapsulated bonding wire portion of the other semiconductor device.

A description will now be given of the semiconductor devices according to the fifth embodiment of the present invention shown in FIG. 19 and 20.

Figure 22:
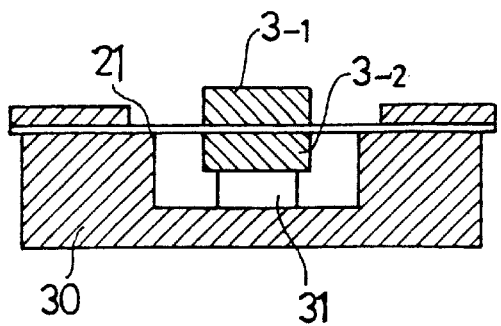
FIG. 22 is an illustration showing a process of mounting semiconductor chips to an interposer.

FIG. 22 is an illustration of a process of mounting semiconductor chips to the interposer 21. In the fifth embodiment of the present invention, semiconductor chips 3-1 and 3-2 are mounted on each sides of the interposer 21, respectively. Accordingly, for example, when mounting the semiconductor chip 3-1 onto the side of the interposer 21 opposite to the side on which the semiconductor chip 3-2 is mounted, the interposer 21 is tuned over and placed on a jig 21 as shown in FIG. 22. Since the semiconductor chip 3-2 is mounted on the lower side of the interposer 21, the jig has a m recessed portion to accommodate the semiconductor chip 3-2. However, there may be a possibility that the interposer 21 warps due to a load applied when the semiconductor chip 3-1 is mounted onto the interposer 21, and, thereby, the semiconductor chip 3-2 contacts the bottom of the recessed portion of the jig 30 which results in damage of the semiconductor chip 3-2. In order to eliminate such a problem, a damper material 31 is provided under the semiconductor chip 3-2 so as to support the semiconductor chip 3-2 so that interposer 21 is prevented from warping due to a load applied to the semiconductor chip 3-1 when mounting the semiconductor chip 3-1 to the interposer 21. It is preferable that the damper material 31 be made of an elastic material having a heat resistance such as NBR, silicon rubber or fluorocarbon rubber.

Figure 23:
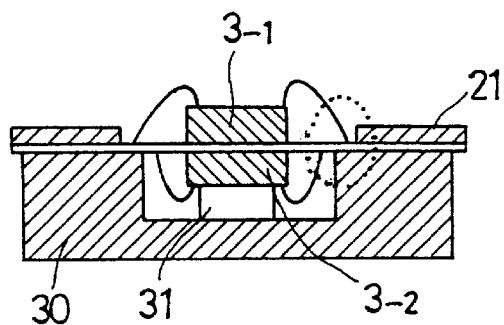
FIG. 23 is an illustration showing a process of bonding a semiconductor chip by a wire bonding method to the interposer having another semiconductor chip mounted thereon.

FIG. 23 is an illustration showing a process of bonding the semiconductor chip 3-1 by a wire bonding method to the interposer 21 having the semiconductor chip 3-2 mounted thereon. When bonding the semiconductor chip 3-1 to the interposer 21 after bonding the semiconductor chip 3-2, a load is applied to the interposer 21 by a wire bonder. Since the interposer 21 is made of a thin substrate, the interposer 21 may warp when a load is applied to the interposer in a state in which only the periphery of the interposer 21 is supported. That is, the center portion of the interposer 21 is depressed downward, which may result in incomplete bonding. In order to eliminate such a problem, the wire bonding portions of the upper semiconductor device are offset from the wire bonding portions of the lower semiconductor device. More specifically, the bonding positions of the lower semiconductor chip 3-2 are located inside of the bonding positions of the upper semiconductor chip 3-1 so that the bonding portions of the interposer 21 are supported by the upper surface of the jig 30 as shown in FIG. 23 when bonding the upper semiconductor chip 3-1, thereby receiving the load of the wire bonder by the jig 30. Therefore, the interposer 21 does not warp when the upper semiconductor chip 3-1 is bonded to the interposer 21.

Figure 24A:
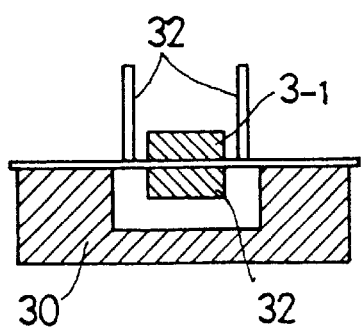
FIG. 24A is a side view of the interposer for explaining a method to eliminate a problem caused by the warp of the interposer.
Figure 24B:
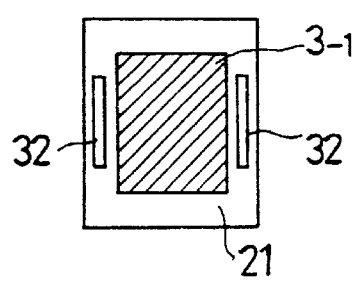
FIG. 24B is a plan view of the interposer shown in FIG. 24A.

FIG. 24A is a side view of the interposer for explaining a method to eliminate a problem caused by the warp of the interposer. FIG. 24B is a plan view of the interposer shown in FIG. 24A. In the method shown in FIGS. 24A and 24B, pressing members 32 are pressed against the interposer 21 at portions where the wire bonding is not applied. That is, the interposer 21 is intentionally warped so that a certain level of tension force is generated in the interposer 21. By dosing so, when a load is applied to the interposer 21 so as to bond the semiconductor device to the interposer 21, the interposer 21 does not warp further. Thereby, the wire bonding can be normally performed.

It should be noted that a supporting member may be provided under the interposer 21 at portions where the pressing members 32 are pressed so that the interposer 21 is held between the pressing members 32 and the supporting member.

Figure 25:
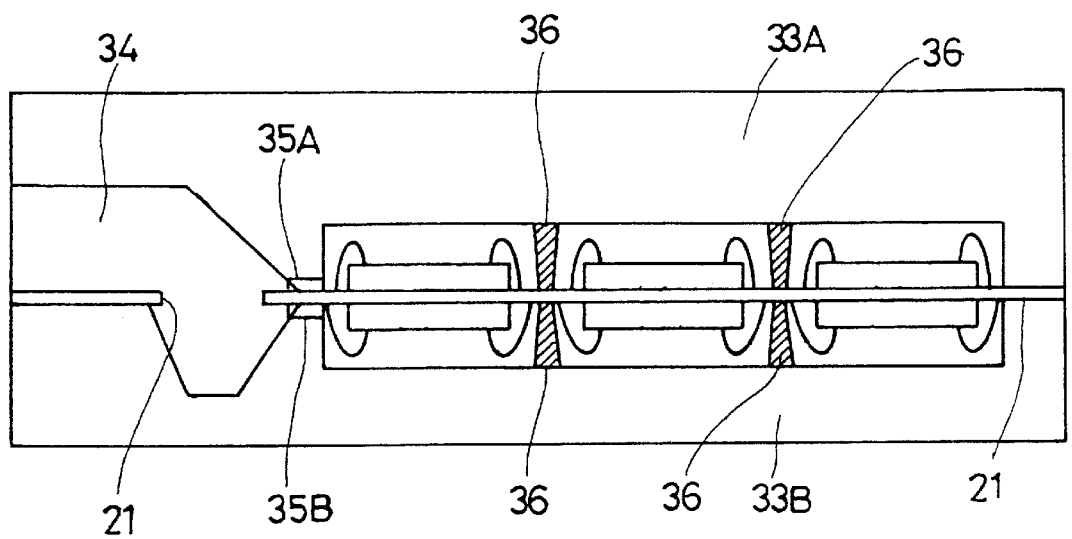
FIG. 25 is a cross-sectional view of a mold die for encapsulation.
Figure 26:
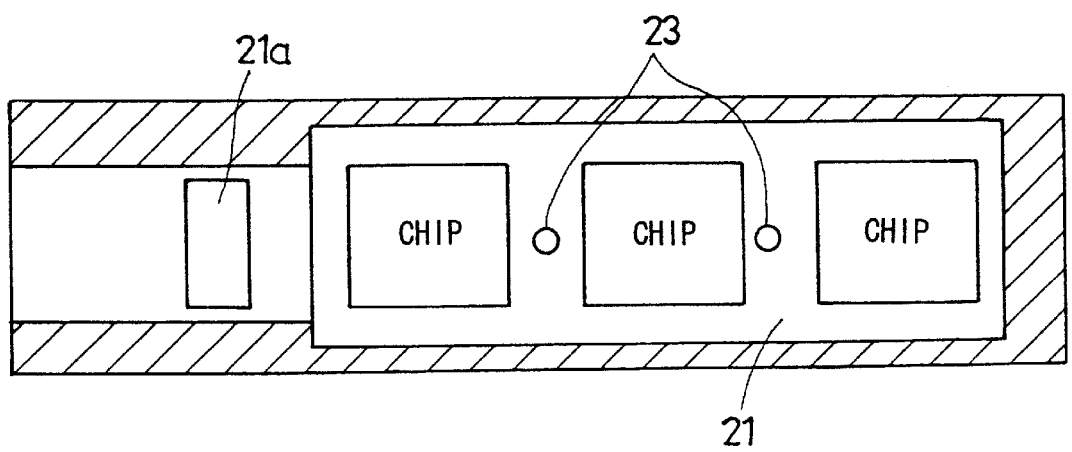
FIG. 26 is a plan view of an interior of the mold die shown in FIG. 25.

A description will now be given of a process of encapsulating the semiconductor device according to the fifth embodiment of the present invention. In this process, a plurality of semiconductor devices are formed on the interposer 21, and the plurality of semiconductor devices are encapsulated at the same time. FIG. 25 is a cross-sectional view of a mold die for encapsulation. FIG. 26 is a plan view of an interior of the mold die shown in FIG. 25.

In the process of encapsulation shown in FIG. 25, three semiconductor devices are encapsulated at the same time. Accordingly, the total of six semiconductor chips are mounted to the interposer 21. The interposer 21 shown in FIG. 25 has a size sufficient for mounting three semiconductor chips on one side thereof, and further has a portion extending toward a runner 34 of the mold die 33A, 33B. Accordingly, in order to inject a seal resin to both sides of the interposer 21, a runner and gate must be provided to-each of the upper and lower mold dies 33A and 33B. However, in the present embodiment, the runner 34 is provided to only the upper mold die 33A and an opening 21a is provided to the interposer 21 at a position near the gates 35A and 35B so that the seal resin is introduced into both the upper and lower sides of the interposer 21. That is, a part of the seal resin injected from the runner 34 of the upper mold die 33A is introduced into the lower side of the interposer 21 through the opening 21a. The seal resin introduced into both the upper side and the lower side is injected into both the upper and lower mold dies 33A and 33B through the gates 35A and 35B. respectively, at the same speed. Accordingly, the semiconductor chips mounted on both sides of the interposer 21 can be encapsulated at the same time with a simple structure.

Additionally, in order to encapsulate the plurality of semiconductor devices as shown in FIG. 25, the size of the interposer must be large, which may results in warp of the interposer 21 within the mold dies 33A and 33B. In order to prevent the interposer 21 from warping, warp preventing pins 36 are provided to the mold dies 33A and 33B. The warp preventing pins 36 protrude from the inner surface of each of the upper and lower mold dies 33A and 33B so as to contact with the interposer 21 from both sides. Accordingly, the interposer 21 is supported by the warp preventing pins 36 so that the interposer 21 is prevented from warping. It should be noted that portions indicated by reference numeral 23 in FIG. 26 are portions to which the warp preventing pins 23 contact.

When the distance between the adjacent semiconductor chips is small, it is preferable that each of the warp preventing pins 23 be tapered so as to prevent the warp preventing pins 23 from contacting the bonding wires. Additionally, the warp preventing pins 23 are not always provided to both the upper and lower mold dies 33A and 33B, and the warp preventing pins 23 may be provided only to the lower mold die 33B so as to prevent the interposer 21 form warping due to its own weight.

Figure 27:
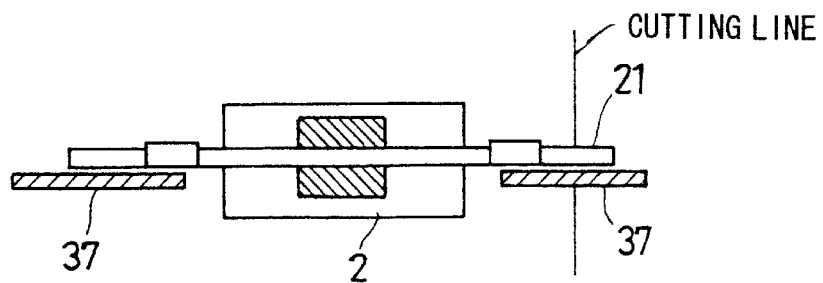
FIG. 27 is an illustration for explaining a cutting process for cutting the interposer.

The thus-formed semiconductor devices are divided into individual semiconductor devices after unnecessary gate burrs are removed. In the cutting process shown in FIG. 27, the cutting is performed while the semiconductor devices are fixed to an adhesive tape such as a UV tape which can be easily removed. However, since the seal resin is provided to both sides of the interposer 21, the UV tape adheres only to the seal resin and does not adhere to the interposer 21. Thus, a portion of the UV tape 37 corresponding to the seal resin 2 is the cut out so that the UV tape 37 can adhere to the interposer 21, thereby achieving a stable cutting operation.

Alternatively, portions of the interposer 21 protruding from the seal resin 2 are cut out by punching or laser cutting before cutting the seal resin 2, and the seal resin 2 is solely cut in the cutting process by adhering the UV tape 37 to only the seal resin 2. In this case, the portions of the interposer 21 to be previously removed may be provided with a partially cut line so as to facilitate the removal of the portions of the interposer 21.

Figure 28:
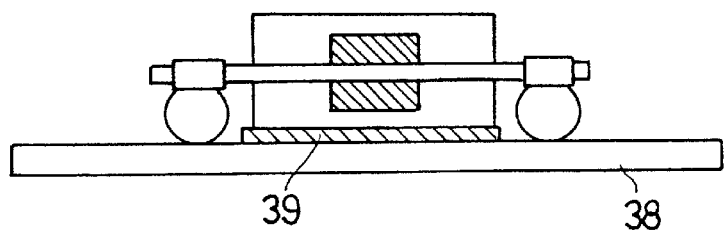
FIG. 28 is an illustration of the semiconductor device according to the fifth embodiment of the present invention in a state in which the semiconductor device is mounted on a substrate.

FIG. 28 is an illustration of the semiconductor device according to the fifth embodiment of the present invention in a state in which the semiconductor device is mounted on a substrate 38. As shown in FIG. 28, the semiconductor device can be mounted onto the substrate 38 such as a motherboard in a stable state by providing a buffer material 39 between the lower seal resin and the substrate 38. The buffer material 39 has a function to dump an external force applied to the semiconductor device: a function to fix the semiconductor device to the substrate 38; and a function to release heat generated in the semiconductor device to the substrate.

Not limited to the semiconductor device according to the fifth embodiment of the present embodiment, the buffer material 39 shown in FIG. 28 can be applied to a semiconductor chip in which a semiconductor chip is encapsulated on the lower side of the interposer.

Figure 29:
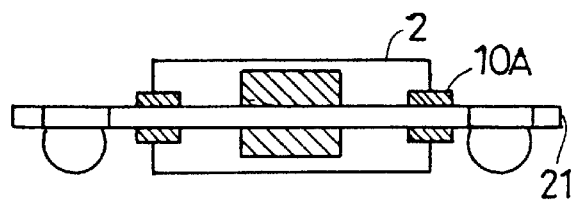
FIG. 29 is an illustration of a semiconductor device having resist layers (insulating layers) provided along the boundary of the seal resin.

FIG. 29 is an illustration of a semiconductor device having resist layers (insulating layers) provided along the boundary of the seal resin 2. In the semiconductor device shown in FIG. 29, a part where the semiconductor chip is mounted is not provided with the resist layer 10A, and the resist layer 10A is provided only to a part where the solder balls 7 are provided. Accordingly, the resist layers 10A are present along the parting lines between the interposer 21 and each of the upper and lower mold dies, and formation of burrs is prevented by the elasticity of the resist layers 10A. Additionally, the resist layers 10A reinforce the interposer 21, which prevents the interposer 21 from warping. Since the resist layers 10A are not provided in parts where the semiconductor chips are mounted, the height of the semiconductor device can be reduced by the thickness of the resist layers 10A.

Although the semiconductor device according to the fifth embodiment of the present invention is shown in FIG. 29, the structure of the resist layers 10A can be applicable to the semiconductor devices according to other embodiments of the present invention.

Figure 30:
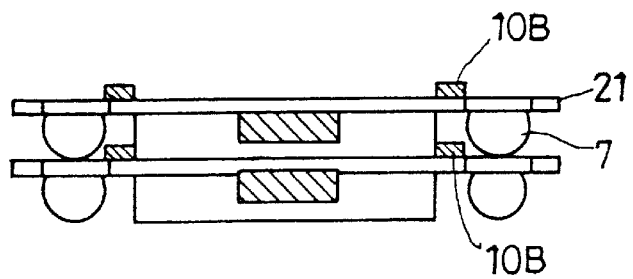
FIG. 30 is an illustration of a stacked structure of semiconductor devices in which a resist layer is used for positioning the semiconductor devices.

FIG. 30 is an illustration of a stacked structure of semiconductor devices in which the resist layer is used for positioning the semiconductor devices. In FIG. 30, the resist layer 10B is not provided to a part where the real resin is provided but provided to a position where the seal resin 2 of the upper semiconductor device is positioned by the resist layer 10B of the lower semiconductor deice when the semiconductor devices are stacked.

Figure 32:
FIG. 32 is an illustration of stacked structures in which three semiconductor chips are stacked.
Figure 32:
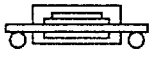
Figure 32:
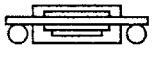
Figure 32:
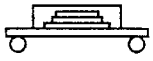
Figure 32:

FIGS. 31 through 33 are illustrations for explaining various stacked structures of semiconductor devices according to the above-mentioned embodiments. FIG. 31 is an illustration of a stacked structure in which two semiconductor chips are stacked; FIG. 32 is an illustration of a stacked structure in which three semiconductor chips are stacked; and FIG. 33 is an illustration of a stacked structure in which four semiconductor chips are stacked. In each of the figures, the number of semiconductor chips is indicated in the leftmost column, and the stacked structures are shown in the second column. The number of interposers included in each of the stacked structures is indicated in the third column. A type of external terminals is indicated in the fourth and fifth columns. That is, a mounting method applicable to each of the stacked structures is indicated in the fourth and fifth columns. In the fourth column, a circle (○) indicates that a BGA (ball grid array) is applicable, and a cross (x) indicates that the BGA is not applicable. In the fifth column, a circle (○) indicates that an LGA (land grid array) is applicable, and a cross (x) indicates that the LGA is not applicable.

Additionally, the sixth trough eighth columns indicate a method applicable to connection of the semiconductor chips provided in each of the stacked structures. That is, in the sixth column, a circle (○) indicates that the semiconductor chip can be connected by a wire bonding method, and a cross (x) indicates that the semiconductor chip cannot be connected by the wire bonding method. In the seventh column, a circle (○) indicates that the semiconductor chip can be connected by a flip chip bonding method, and a cross (x) indicates that the semiconductor chip cannot be connected by the flip chip bonding method. In the eighth column, a circle (○) indicates that the semiconductor chip can be connected by a TAB (tape automated bonding) method, and a cross (x) indicates that the semiconductor chip cannot be connected by the TAB method.

Further, the ninth and tenth columns indicate kinds of semiconductor chips which can be combined in each of the stacked structures. That is, in the ninth column, a circle (○) indicates that the same kind of semiconductor chips can be combined, and a cross (x) indicates that the same kind of semiconductor chips cannot be combined. In the tenth column, a circle (○) indicates that different kinds of semiconductor chips can be combined, and a cross (x) indicates that different kinds of semiconductor devices cannot be combined.

A description will now be given of a method for stacking the semiconductor devices in the stacked structures shown in FIGS. 31 through 33. In the following description, it is assumed that the semiconductor devices 40 described with reference to FIG. 3 are stacked.

Figure 34:
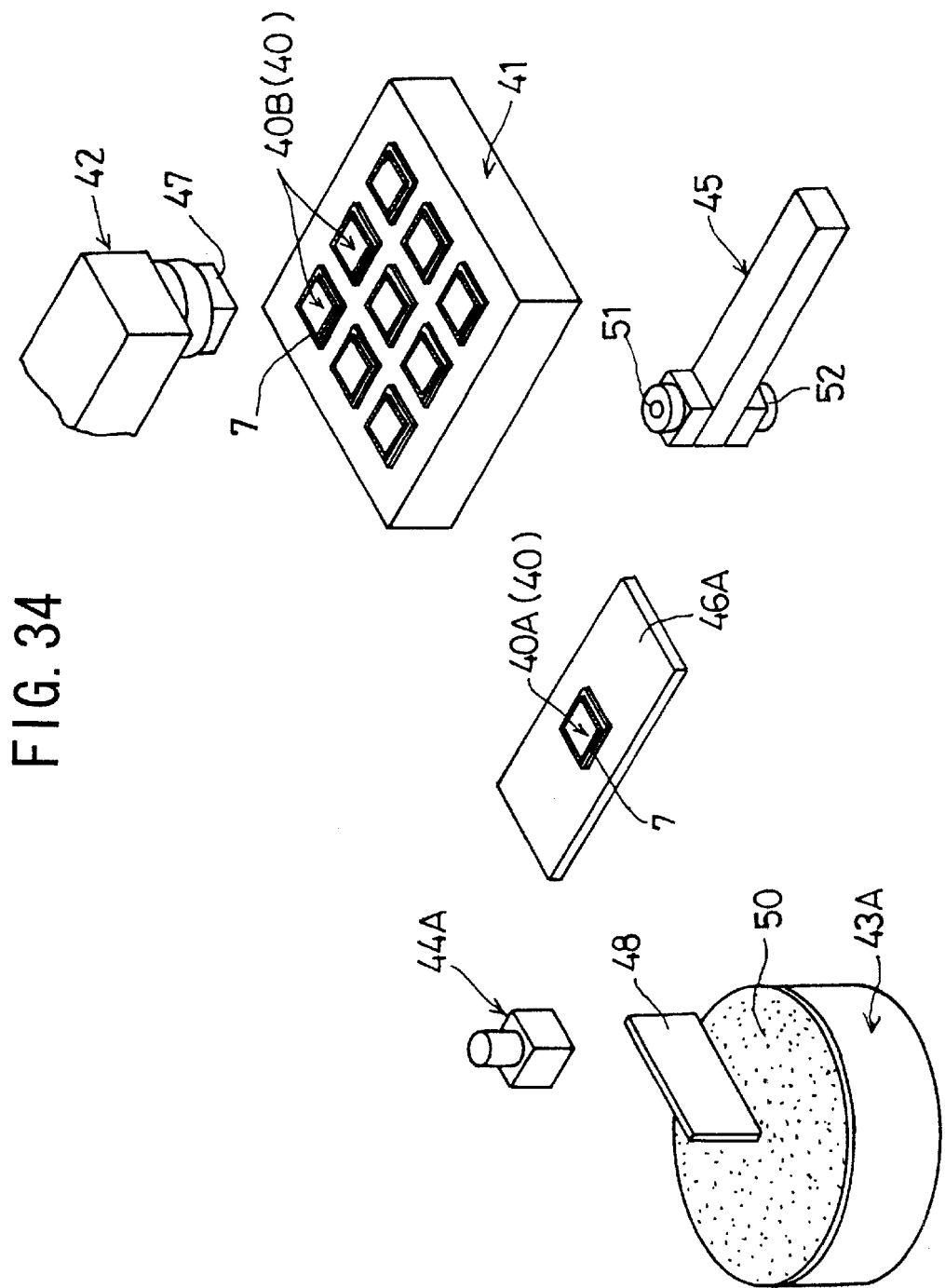
FIG. 34 is a perspective view of parts of a stacking apparatus used for stacking the semiconductor devices shown in FIG. 3.

FIG. 34 is a perspective view of parts of a stacking apparatus used for stacking the semiconductor devices 40. The stacking apparatus shown in FIG. 34 comprises a package supply table 41, a stack head 42, a flux supply unit 43A, a transfer head 44A and a camera unit 45.

The package supply table 41 is used for temporarily place the semiconductor devices 40 which are manufactured by the aforementioned method. That is, in this embodiment, each of the semiconductor devices 40 is placed on the package supply table 41 so that the solder balls 7 face upward.

It should be noted that the semiconductor devices 40 after being manufactured are conveyed to the stacking apparatus by being accommodated in a conveying tray. At this time, the semiconductor chips 40 are accommodated in the conveying tray in a state in which the solder balls face downward so as to protect the solder balls 7. Accordingly, in the present embodiment, the semiconductor chips 40 taken out of the conveying tray are turned upside down and are placed on the package supply table 41.

The stack head 42 are movable in three-dimensional directions by a moving apparatus (not shown in the figure) such as a robot. Additionally, an end of the stack head 42 is provided with a suctioning head unit 47, which is connected to a suctioning apparatus so that the semiconductor chips 40 can be held by suction.

The flux supply unit 43A applies a flux 50 to the transfer head 44A. The flux supply unit 43A has a cylindrical shape, and a top surface thereof has a flat surface having high flatness. The flux 50 is squeezed by a squeegee 48 so as to be a predetermined uniform thickness after being applied to the top surface of the flux supply unit 43A. The thickness of the flux 50 can be set to an arbitrary thickness by adjusting a clearance between the squeegee 48 and the flux supply unit 43A.

The transfer head 44A is movable in three-dimensional directions by a moving apparatus (not shown in the figure) such as a robot. The flux 50 is transferred from the flux supply unit 43A to the transfer head 44A by the lower end of the transfer head 44A being pressed against the flux 50 provided to the flux supply unit 43A.

The camera unit 45 has a camera 51 taking a picture of an upper portion and a camera 52 taking a picture of a lower portion. The camera unit 45 is used for positioning each of the semiconductor devices 40 as described later.

It should be noted that, in the present embodiment, two semiconductor devices are stacked. Additionally, the lower semiconductor device is indicated by reference numeral 40A, and the upper semiconductor device is indicated by reference numeral 40B. Further, when upper or lower semiconductor devices are referred to as a whole, the semiconductor devices are indicated by reference numeral 40.

As shown in the figure, the camera unit 45 comprises the upper camera 45 and the lower camera 52 in an integral form so that, when the semiconductor devices 40 are stacked, an image of the upper semiconductor device 40B located above and an image of the lower semiconductor device 40A located under can be simultaneously taken. Accordingly, there is no need to turn over the camera unit as is in a camera unit having a single camera, which results in an efficient positioning of the semiconductor devices 40.

A description will now be given of a method for stacking the semiconductor devices 40A and 40B performed by the above-mentioned stacking apparatus.

Figure 35:
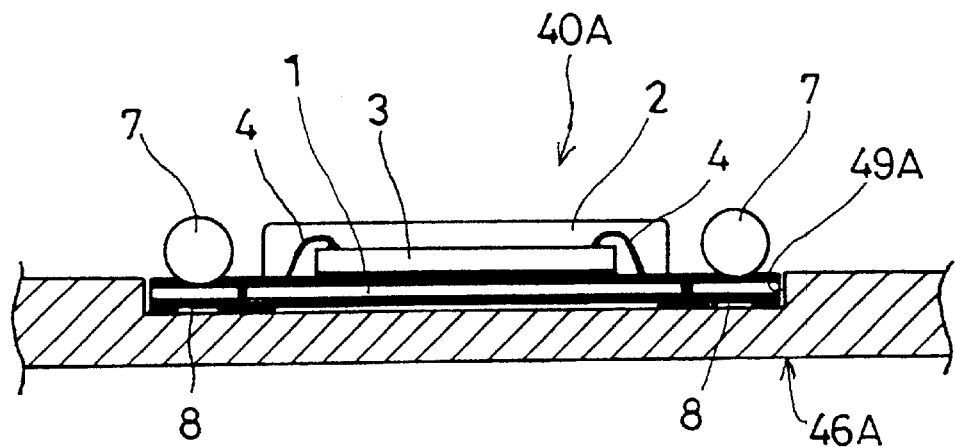
FIG. 35 is a side view of a semiconductor device placed on a carrier stage.

In order to stack the semiconductor devices 40A and 40B, one of the semiconductor device 40A is attached first to a carrier stage 46A. The carrier stage 46A is a base table when the semiconductor devices 40A and 40B are stacked. FIG. 35 is a side view of the semiconductor device 40A placed on the carrier stage 46A.

As shown in FIG. 35, the carrier stage 46A is provided with attaching groove 49A used for positioning the semiconductor device 40A. The stack head 42 conveys one of the semiconductor devices 40 from the package supply table 41 to the carrier stage 46A, and places the semiconductor device 40 within the attaching groove 49A.

As mentioned above, the semiconductor devices 40 are placed on the package supply table 41 in a state in which the solder balls 7 face upward. Additionally, the stack head 42 holds the semiconductor device 40 by suctioning the surface of the seal resin 2 of the semiconductor device 40. Accordingly, in a state in which the semiconductor device 40 is attached on the carrier stage 46A, the semiconductor device 40 is positioned so that solder balls 7 face upward.

Figure 36:
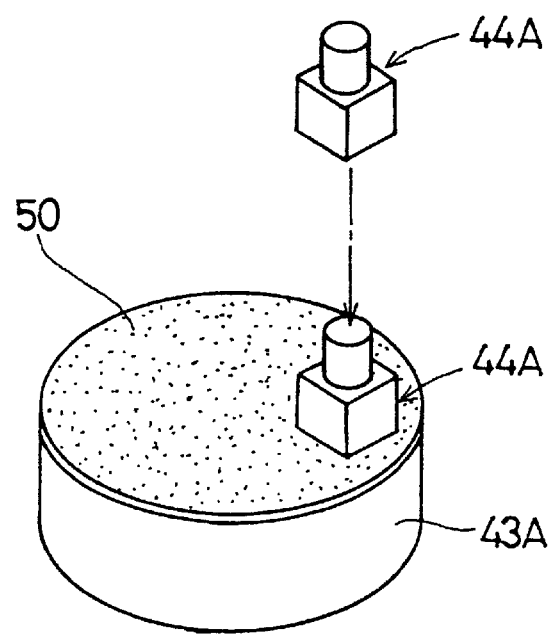
FIG. 36 is a perspective view of a flux supply unit and a transfer head.
Figure 37:
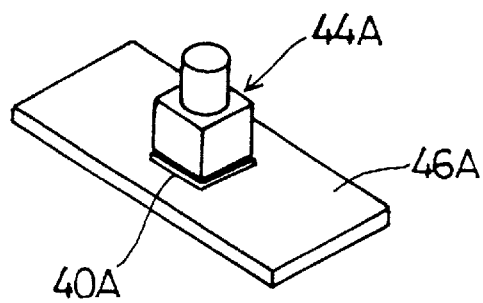
FIG. 37 is a perspective view of a carrier stage and the transfer head.

After the conveyance of the semiconductor device 40A, the flux 50 is applied to the transfer. head 44A. The application of the flux 50 can be performed at the same time the semiconductor device 40A is conveyed. In order to apply the flux 50 to the transfer head 44A, the transfer head 44A is pressed against the flux supply unit 43A on which the flux 50 is applied as shown in FIG. 36. As mentioned above, the flux 50 had been applied to the flux supply unit 43A with a predetermined uniform thickness. Accordingly, the flux 50 can be applied to the transfer head 44A by simply pressing the transfer head 44A against the flux supply unit 43A.

The transfer head 44A having the flux 50 is moved to the carrier stage 46A. Then, the transfer head 44A is pressed against the semiconductor device 40A attached to the carrier stage 46A. As mentioned above, the semiconductor device 40A is positioned on the carrier stage 46A so that the solder balls 7 faces upward. Accordingly, the flux 50 on the transfer head 44A is transferred onto the solder balls 7 when the transfer head 44A is pressed against the semiconductor device 40A.

At this time, in the present embodiment, the flux 50 on the transfer head 44A is transferred only to the solder balls 7, and does not adhere to other parts of the semiconductor device 40A. A description will new be give of the reason.

Figure 38:
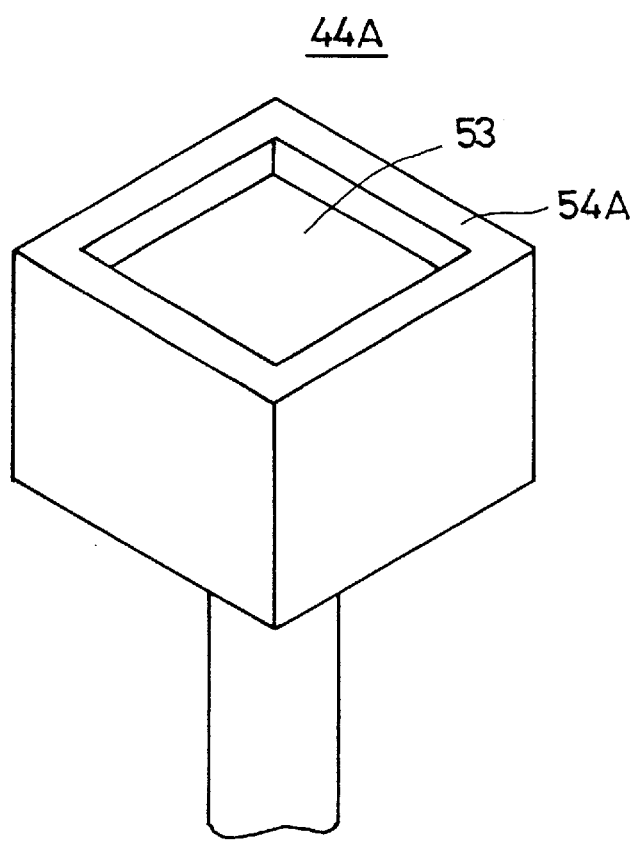
FIG. 38 is a perspective view of the transfer head viewed from a bottom side.

FIG. 38 is a perspective view of the transfer head viewed from the bottom thereof. The bottom of the transfer head 44A is pressed against the flux supply unit 43A and the semiconductor device 40A. The bottom of the transfer head 44A is provided with a depression 53 so that the protruding portion surrounding the depression 53 is formed as a flux applying part 54A.

The position of the flux applying part 54A corresponds to the position of the solder balls 7 on the semiconductor device 40A. Additionally, the position of the depression 53 corresponds to the position of the seal resin 2 of the semiconductor device 40A. Accordingly, when the bottom of the transfer head 44A is pressed against the flux supply unit 43A, the flux 50 adheres only to the flux applying part 54A, and does not adhere to the interior of the depression 53.

Figure 40:
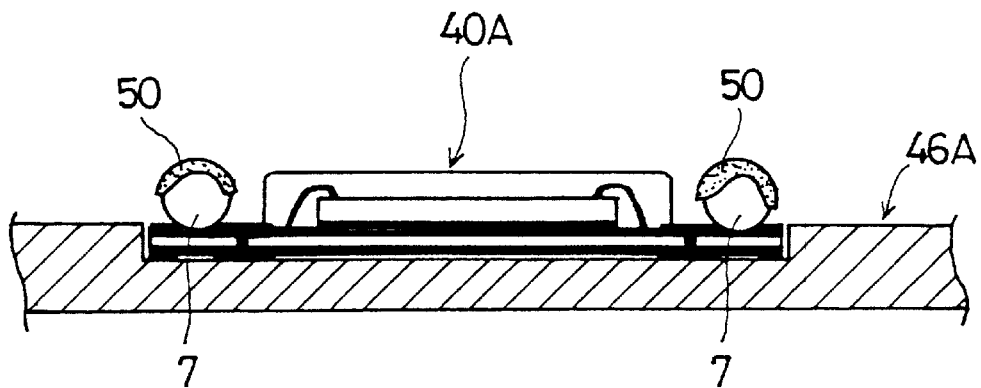
FIG. 40 is a side view of the semiconductor device whose solder balls are-provided with flux.
Figure 41:
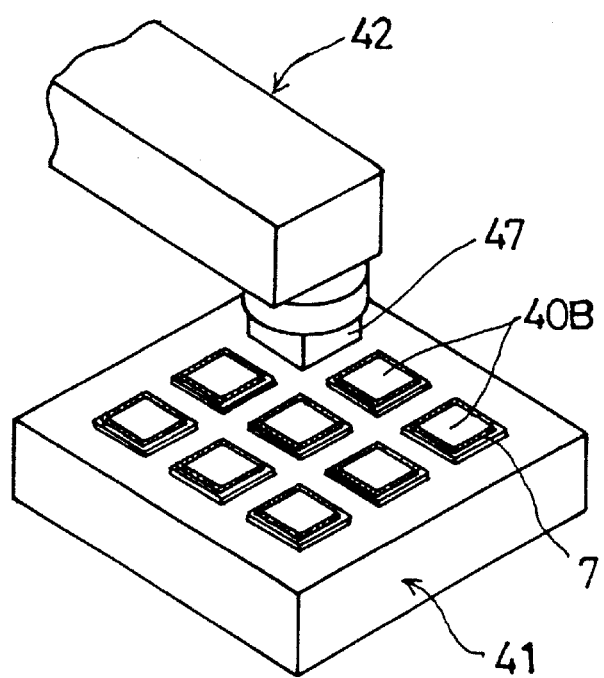
FIG. 41 is a perspective view of the semiconductor devices placed on a package supply table.
Figure 42:
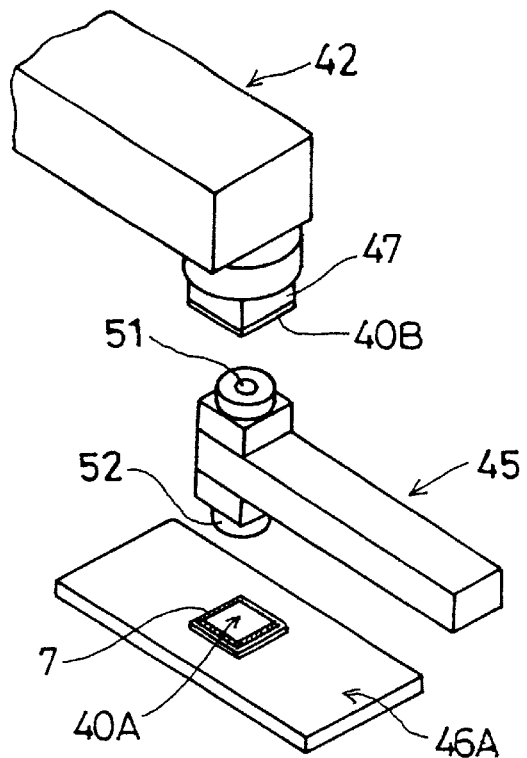
FIG. 42 is a perspective view of a camera unit recognizing positions of the semiconductor devices.
Figure 43:
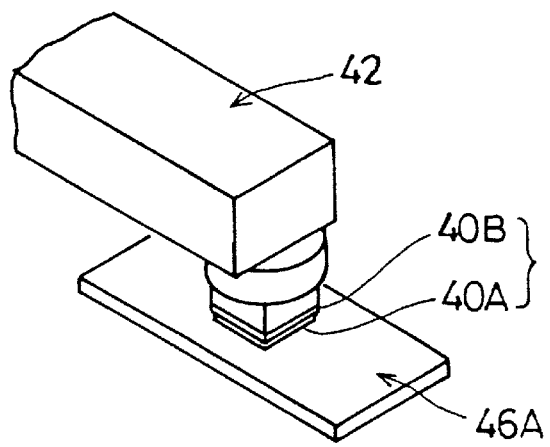
FIG. 43 is a perspective view showing a stack head stacking the semiconductor devices.

Thus, when the transfer head 44A having the flux 59 is pressed against the semiconductor device 40A, the flux 50 is transferred onto only the solder balls 7 as shown in FIG. 40. Additionally, when the transfer head 44A is pressed against the semiconductor device 40A, the seal resin 2 is opposite to the depression 53 of the transfer head 44A. Accordingly, the flux 50 is prevented from being mistakenly applied to the seal resin 2.

After the flux 50 is applied, a staking process for stacking the semiconductor devices 40A and 40B and a reflow process for connecting the solder balls to the ball pads 8 of the semiconductor device 40B are performed. At this time, if the flux 50 is present in a position other than the position at which the solder balls 7 are provided, a conductive metal such as solder included in the flux 50 is melted, and a short circuit may occur between adjacent solder balls or adjacent ball pads.

However, in the present embodiment, since the flux 50 is applied only to the solder balls 7, adjacent solder balls or and the adjacent ball pads are prevented from being short circuited, achieving an improved reliability.

In order to positively prevent the adjacent solder balls 7 and the adjacent ball pads 8 from being short circuited, an appropriate amount of the flux 50 must be transferred onto the solder balls 7. This is because if the flux 50 is transferred onto the solder balls in excess, the excess flux 50 may cause a short circuit between the adjacent solder balls 7 or the adjacent ball pads 8.

Additionally, is the amount of the flux 50 transferred onto the solder balls 7 is insufficient, a oxidation film may be formed on the solder balls 7, and incomplete connection may occur between the solder balls 7 and the respective ball pads 8. It should be noted that the flux 50 has a function to prevent the solder balls 7 from being oxidized during a heating process.

As for the method for transferring an appropriate amount of the flux 50 onto the solder balls 7, there is a method for controlling the thickness of the flux 50 applied onto the flux supply unit 43A. Besides, there is a method for appropriately selecting the configuration of the flux applying part 54 provided on the transfer head 44A. A description will now be given, with reference to FIGS. 39A through 39C, of an appropriate configuration of the flux applying part 54A.

Figure 39A:
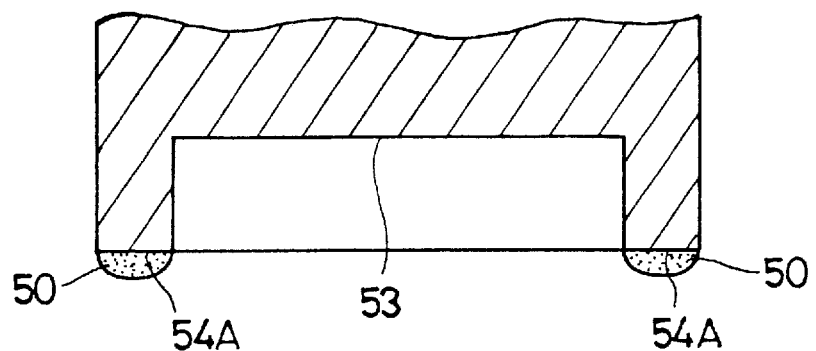
FIGS. 39A is a cross-sectional view of a part of the transfer head having a flux applying part having a flat surface.

FIGS. 39A is a cross-sectional view of a part of the transfer head 44A provided with the flux applying part 54A having a flat surface 54A. In a case in which the flux applying part has the flat surface as shown in FIG. 39A, the amount of the flux 50 is not as large as that shown in FIGS. 39B and 39C.

Figure 39B:
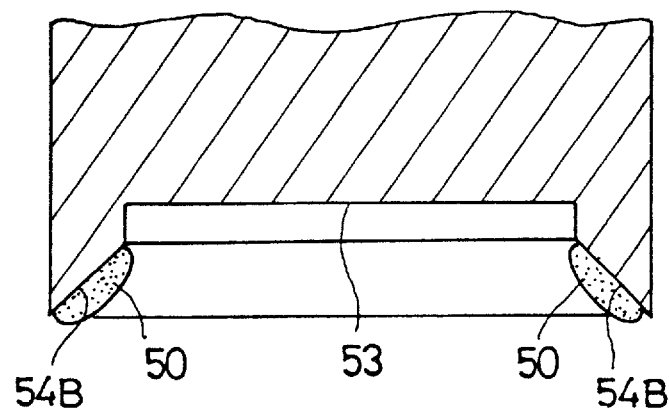
FIG. 39B is a cross-sectional view of a part of the transfer head having a flux applying part having a tapered surface.
Figure 39C:
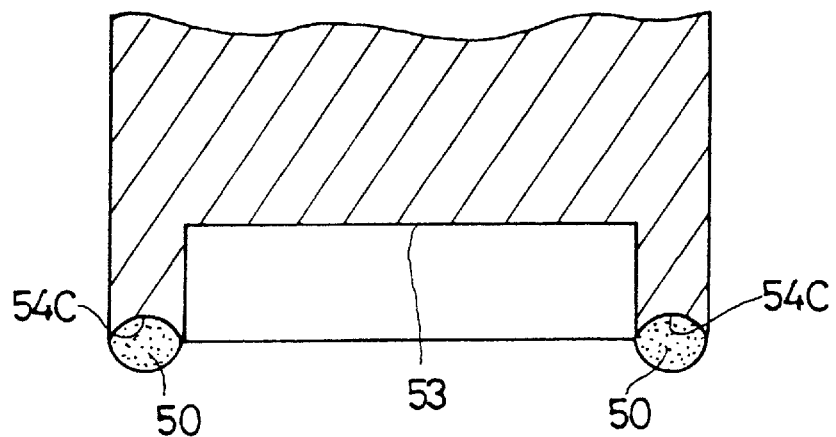
FIG. 39C is a cross-sectional view of a part of the transfer head having a flux applying part having a concave surface.

FIG. 39B is a cross-sectional view of a part of the transfer head 44A provided with a flux applying part 54B having a tapered surface. FIG. 39C is a cross-sectional view of a part of the transfer head 44A provided with the flux applying part 54C having a spherical surface. By changing the configuration of the flux applying part, the amount of the flux 50 adhering to the flux applying part can be controlled. Thus, an appropriate amount of the flux 50 can be applied to the solder balls 7.

After the transfer process of the flux 50 to the solder balls 7, the stack head 42 moves to a position above the package supply table 41, and then moves down so as to pick up another semiconductor device 40 as the semiconductor device 40B to be stacked on the semiconductor device 40A. In relation to the movement of the stack head 42, the camera unit 45 moves to a position above the carrier stage 46A. At this time, the camera unit 45 moves to a position where the lower camera 52 is opposite to the semiconductor device 40A attached to the carrier stage 46A.

The stack head 42 holds and conveys the semiconductor device 40B to a position opposite to the upper camera 51 of the camera unit 45. Thereby, the semiconductor device 40A is positioned on the lower side and the semiconductor device 40B is positioned on the upper side with the camera unit 45 located therebetween. Accordingly, the upper camera 51 can recognize the positions of the ball pads 8 of the semiconductor device 40B, and the lower camera 52 can recognize the positions of the solder balls 7 of the semiconductor device 40A.

Figure 44:
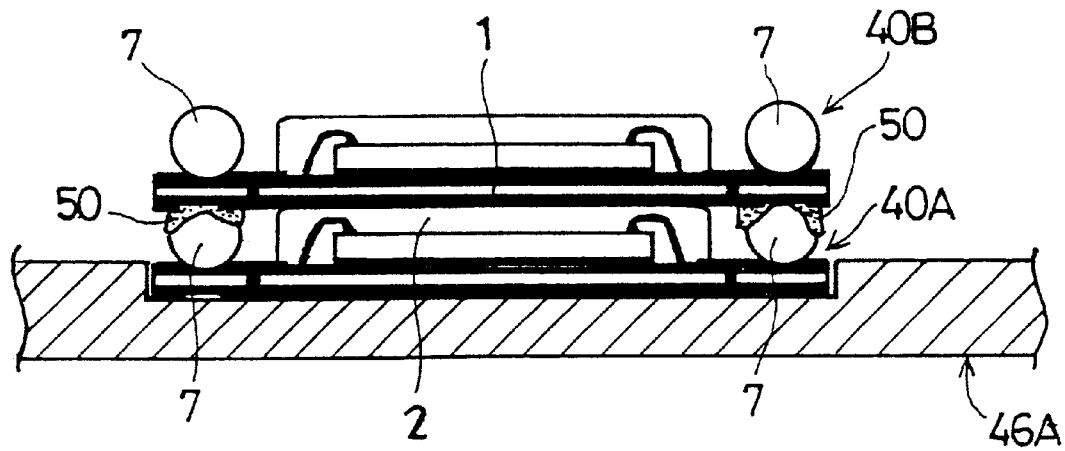
FIG. 44 is a side view of the semiconductor devices in a stacked state.

After the recognition of the positions of the ball pads 8 and the solder balls 7, the stack head places the semiconductor device 40B on the semiconductor device 40A so that the ball pads 8 of the semiconductor device 40B contacts the respective solder balls 7 of the semiconductor device 40A. Thereby, the semiconductor devices 40A and 40B are arranged in the stacked state as shown in FIG. 44. In this state, since the flux 50 is transferred on the upper portion of each of the solder balls 7, the flux 50 does not exist between the seal resin 2 of the lower semiconductor device 40A and the interposer 1 of the upper semiconductor device 40B.

In the state shown in FIG. 44, the semiconductor devices 40A and 40B are temporarily connected to each other by the flux 50 between the solder balls 7 of the semiconductor device 40A and the ball pads 8 of the semiconductor device 40B. The semiconductor devices 40A and 40B are fixed to each other by bonding the solder balls 7 to the ball pads 8 by placing the carrier stage 46A in a reflow furnace in a state in which the semiconductor devices 40A and 40B are stacked.

It should be noted that, although two semiconductor devices 40A and 40B are stacked in the present embodiment, an arbitrary number of semiconductor devices can be stacked by repeating the above-mentioned process.

FIGS. 45 through 48 are illustrations for explaining variations of the above-mentioned method for stacking semiconductor devices.

Figure 45:
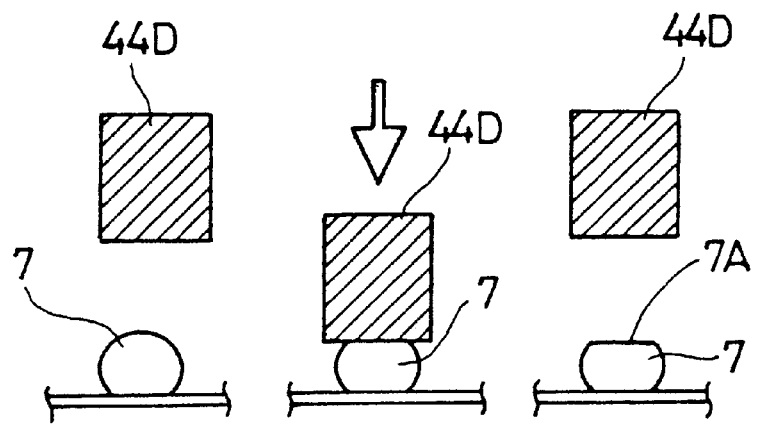
FIG. 45 is an illustration for explaining a method of shaping a solder ball.

In the variation shown in FIG. 45, the solder balls 7 are shaped simultaneously with the transfer of the flux 50 to the solder balls 7. There is dispersion in the size of the solder balls. If the dispersion is large, the solder balls having a larger diameter can be bonded, but the solder balls having a small diameter cannot be bonded.

Accordingly, in this embodiment, the solder balls 7 are leveled by using a transfer head 44D. The transfer had 44D is made of hard stainless steel. As shown in FIGS. 45A and 45B, the solder balls 7 are pressed by the transfer head 44D being moved downward when the flux 50 is being transferred onto the solder balls 7. Thereby, as shown in FIG. 45C, a flat shaped part 7A is formed in the upper portion of the solder balls 7. That is, the height of each of the solder balls 7 can be equalized by leveling the solder balls 7 by the transfer head 44D, thereby preventing occurrence of incomplete connection when the semiconductor devices are stacked. Additionally, since the flat shaped part 7A is formed in the upper portion of each of the solder balls 7, the transfer characteristic of the flux 50 is also improved. Further, since the leveling is performed simultaneously with the transfer of the flux 50, the above-mentioned effects can be achieved without increasing the number of processes for stacking the semiconductor devices.

Figure 46:
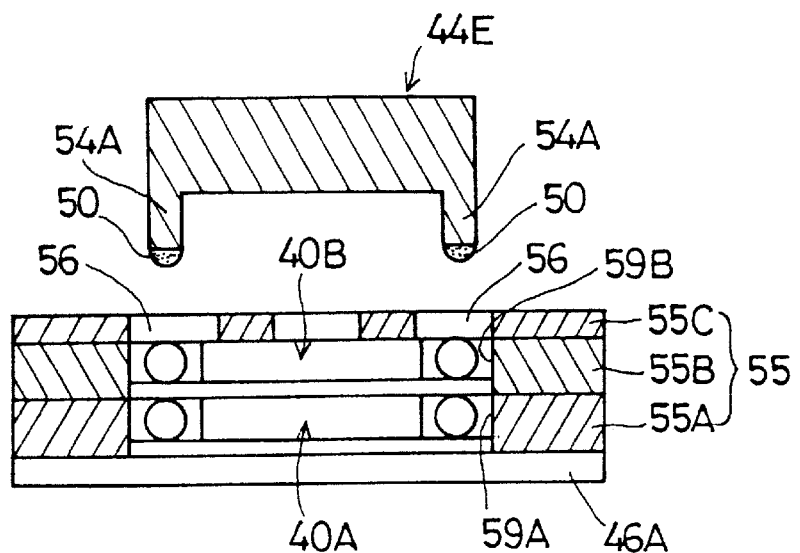
FIG. 46 is a cross-sectional view of a positioning jig for positioning the semiconductor devices.

In the variation shown in FIG. 46, when stacking the semiconductor devices 40A and 40B, each of the semiconductor devices 40A and 40B is positioned by using a positioning jig 55. The positioning jig 55 comprises positioning members 55A, 55B and 55C. The positioning jigs 55A, 55B and 55C are fixed relative to each other in a stacked arrangement by positioning pins and positioning holes (not shown in the figure).

The positioning member 55A is for positioning the semiconductor device 40A by a positioning opening 59A formed therein. That is, the positioning opening 59A accommodates the semiconductor device 40A. The positioning member 55B is for positioning the semiconductor device 40B by a positioning opening 59B formed therein. That is, the positioning opening 59B accommodates the semiconductor device 40B in an accurate position relative to the semiconductor device 40A accommodated in the positioning opening 59A of the positioning member 55A. The positioning member 55C is provided on the positioning member 55B. An opening 56 is formed in the positioning member 55B so that the flux applying part 54A of the transfer head 44E can be inserted into the opening 56.

Accordingly, by attaching the semiconductor devices 40A and 40B to the positioning jig 55, each of the semiconductor devices 40A and 40B can be accurately positioned relative to each other. Thus, the semiconductor device 40A and the semiconductor device 40B do not move relative to each other during the stacking process, thereby preventing the flux 50 form adhering to portions other than solder balls 7.

Figure 47:
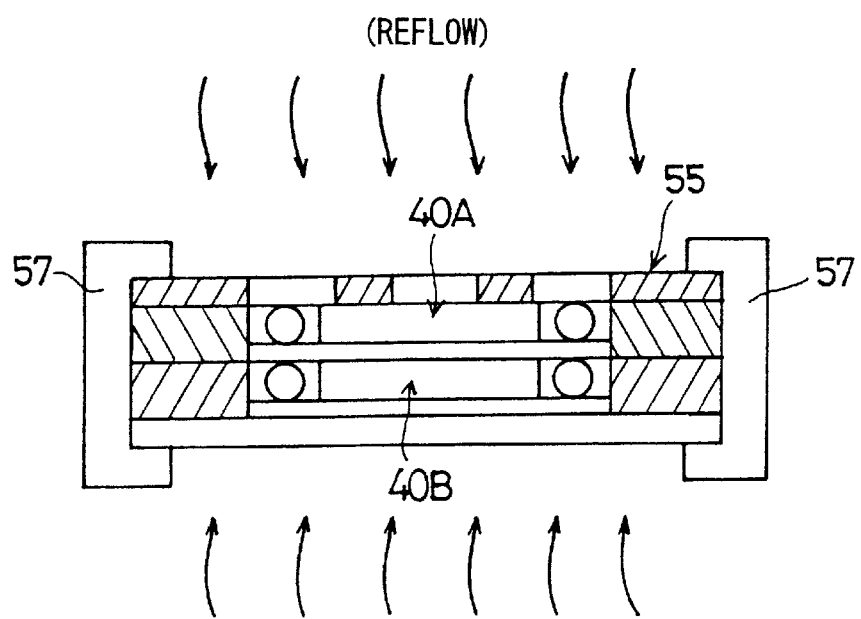
FIG. 47 is a cross-sectional view of the positioning jig fixed by clip members.

In the variation shown in FIG. 47, the positioning jig 55 shown in FIG. 46 is fixed by a clip members 57 so that the semiconductor devices 40A and 40B are subjected to a reflow process in a state in which the semiconductor devices 40A and 40B are accommodated in the positioning jig 55 that is clipped by the clip members 57. According to such a structure, the semiconductor devices 40A and 40B are accurately positioned to each other by the positioning jig 55, and are subjected to the reflow process in a state in which the semiconductor devices 40A and 40B are temporarily connected to each other by the flux 50. Thus, the relative positions of the semiconductor devices 40A and 40B can be maintained while the flux 50 is melted. It should be noted that a heating method for connecting the solder balls 7 to the ball pads 8 is not limited to the reflow process, and a block heater method, a laser method or hot-air method can be used.

Figure 48:
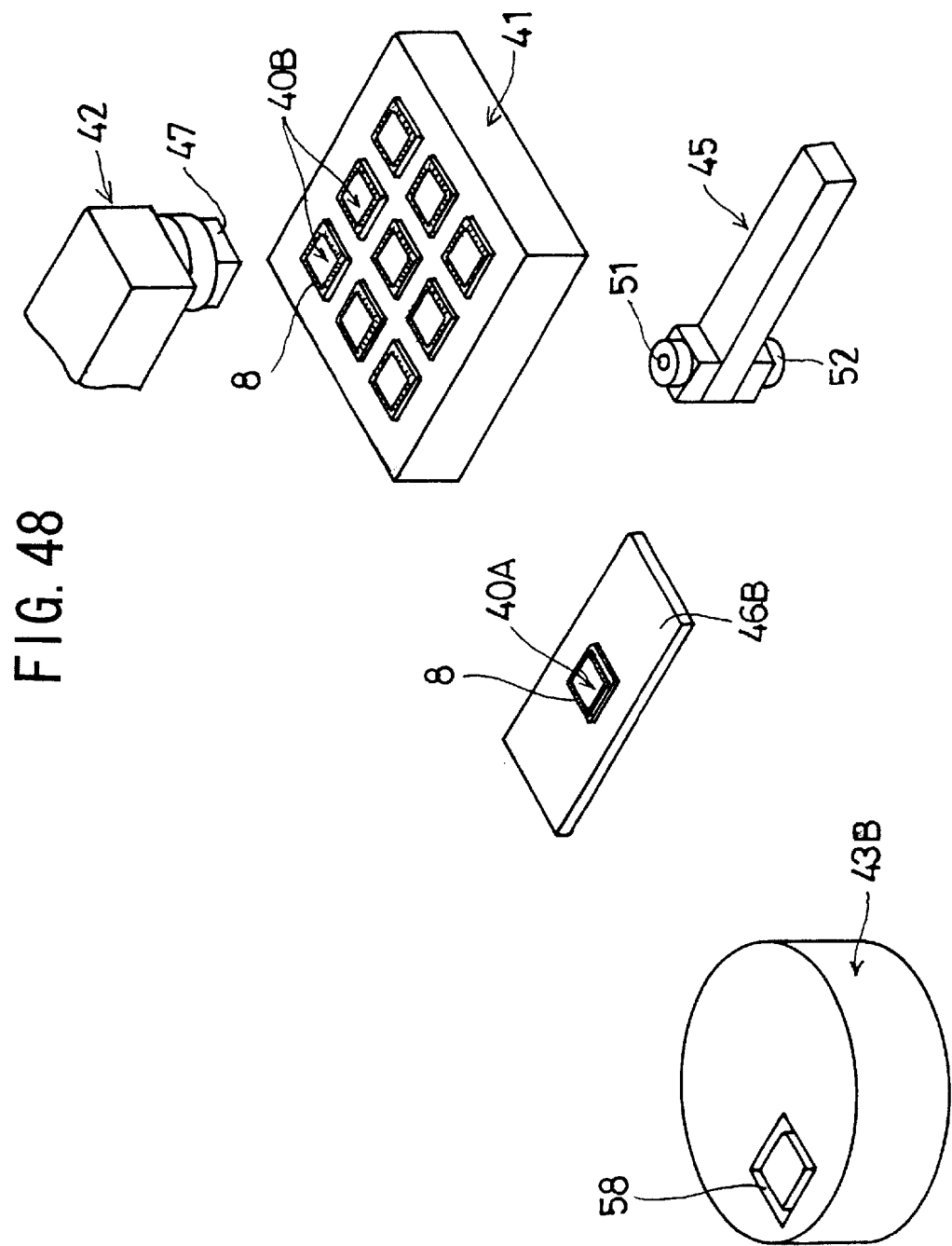
FIG. 48 is a perspective view of parts of a stacking apparatus used for stacking the semiconductor devices.

A description will now be given of another method for stacking the semiconductor devices 40A and 40B. FIG. 48 is a perspective view of parts of a stacking apparatus used for stacking the semiconductor devices 40 in the present embodiment. In FIG. 48, parts that are the same as the parts shown in FIG. 34 are given the same reference numerals, and descriptions thereof will be omitted.

The stacking apparatus shown in FIG. 48 comprises a package supply table 41, a stack head 42, a flux supply unit 43B and a camera unit 45. The stacking apparatus shown in FIG. 48 does not have the transfer head 44A provided in the stacking apparatus shown in FIG. 34, and, thereby, the structure of the stacking apparatus is simplified.

The package supply table 41 has the same structure as that shown in FIG. 34. However, in this embodiment, each of the semiconductor devices 40 is placed on the package supply table 41 in a state in which the solder balls 7 face the package supply table 41. As mentioned above, the semiconductor devices. 40 are accommodated in the convey tray with the solder balls 7 facing downward.

Accordingly, in the present embodiment, each of the semiconductor devices 40 can be placed on the package supply table 41 without being turned over, and, thereby, the semiconductor devices can be easily transferred from the convey tray to the package supply table 41. Additionally, when the stack head 42 picks up the semiconductor device 40 on the package supply table 41, the solder balls 7 of the semiconductor device 40B face downward.

The flux supply part 43B in the present embodiment applies the flux 50 directly to the solder balls 7 of the semiconductor device 40B. The lux supply part 43B has a cylindrical shape, and a flux filling groove 58 is formed on the top surface of the flux supply part 43B. The flux supply part 43B has square shape when viewed from above so that the solder balls 7 are inserted into the flux filling groove 58 so as to transfer the flux 50 to the solder balls 7.

In the present embodiment, the flux 50 is provided only in the flux filling groove 58. The flux 50 can be filled in the flux filling groove 58 by applying the flux 50 on the top surface of the flux supply part 43B and squeezing the flux 50 into the flux filling groove 58 by using the squeegee 48. It should be noted that the thickness of the flux 50 can be controlled to be an arbitrary thickness by adjusting the depth of the flux filling groove 58.

A description will now be given of a method of stacking the semiconductor devices 40A and 40B performed by the stacking apparatus shown in FIG. 48.

Figure 49:
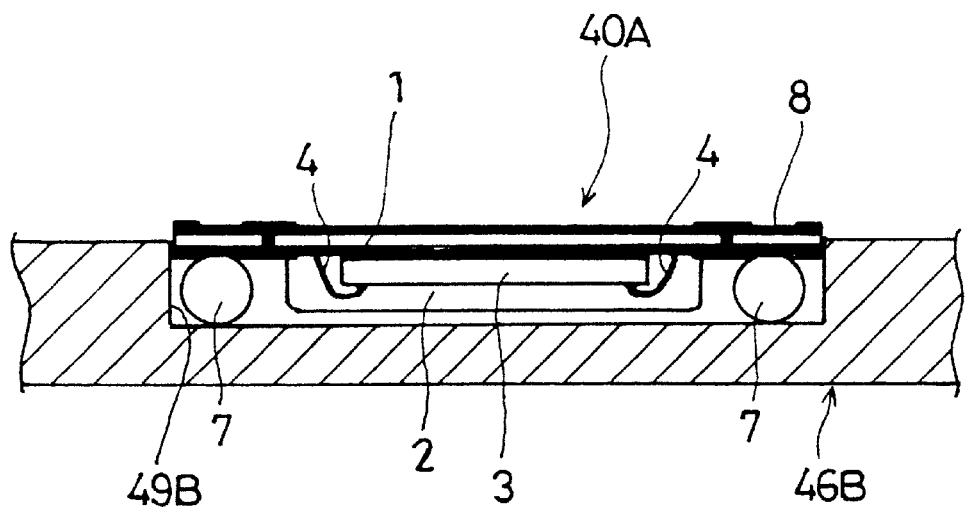
FIG. 49 is a side view of the semiconductor device attached to a carrier stage.

In order to stack the semiconductor devices 40A and 40B, first the lower semiconductor device 40A is attached to the carrier stage 46B. FIG. 49 is a side view of the semiconductor device 40A attached to the carrier stage 46B. As shown in FIG. 49, the carrier stage 46A is provided with an attaching depression 49B for positioning the semiconductor device 40A on the carrier stage 46B. The stack head 42 picks up the semiconductor device 40A on the package supply table 41, and conveys the semiconductor device 40A to the carrier stage 46B so as to attach the semiconductor device 40A within the attaching depression 49B.

As mentioned above, each of the semiconductor devices 40 is placed on the package supply table in a state in which the solder balls 7 face downward. The stack head 42 conveys each of the semiconductor devices 40 by suctioning the interposer of each of the semiconductor devices 40. Accordingly, in a state in which the semiconductor device 40A is attached to the carrier stage 46B, the solder balls 7 of the semiconductor device 40A face downward.

Figure 50:
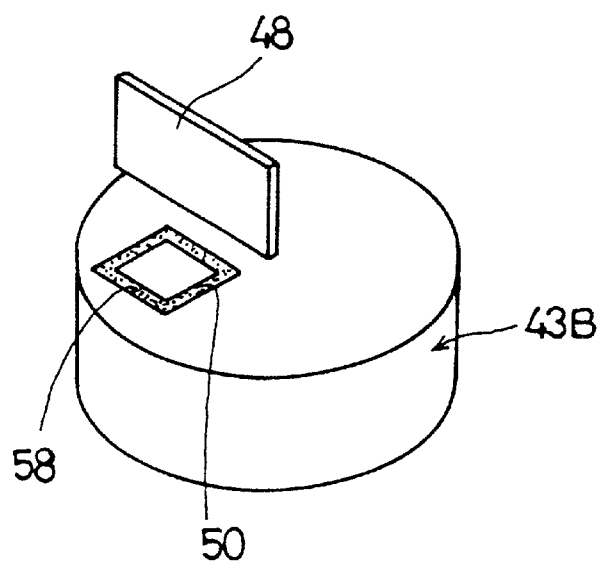
FIG. 50 is a perspective view of the flux applying part having a flux filing groove.
Figure 51:
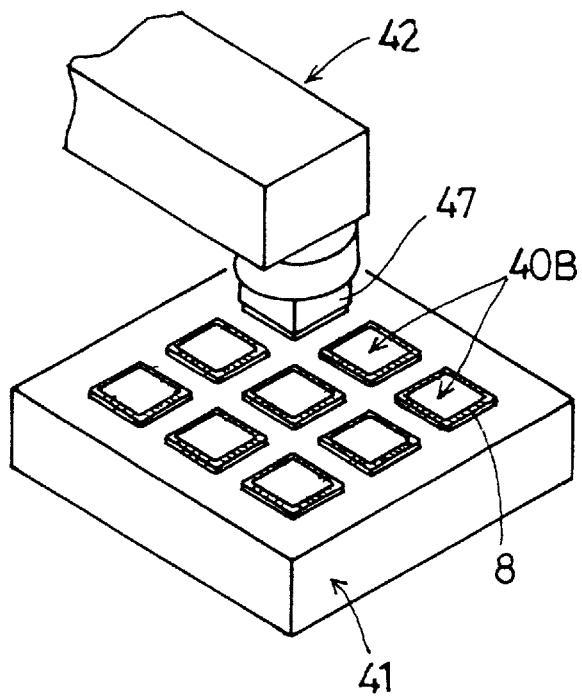
FIG. 51 is a perspective view showing the semiconductor devices placed on the package supply table and picked up by the stack head.

After the semiconductor device 40A is conveyed, the flux 50 is applied to the flux applying part 43B by using the squeegee 48 as shown in FIG. 50. It should be noted that the application of the flux 50 may be performed simultaneously with the conveyance of the semiconductor device 40A. After the application of the flux 50 is completed, the stack head 42 moves to a position above the package supply table 41 and moves down so as to hold the semiconductor device 40B to be stacked on the semiconductor device 40A as shown in FIG. 51.

Figure 52:
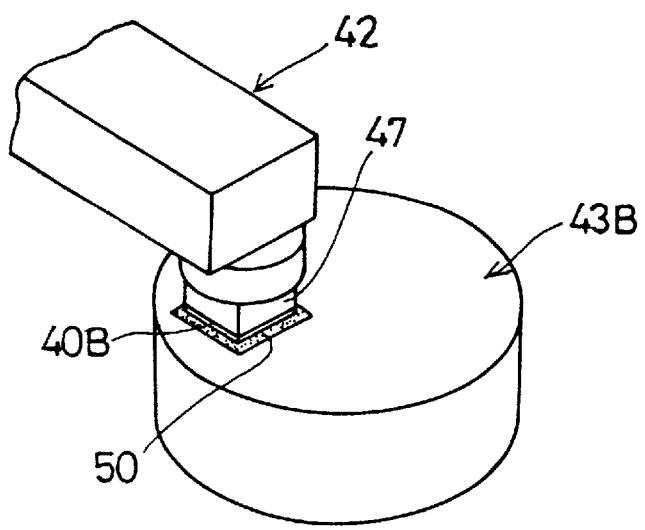
FIG. 52 is a perspective view of the flux applying part and the stack head for explaining a process for applying flux to the semiconductor device.

The stack head 42 conveys the semiconductor device 40B to a position above the flux filling groove 58 of the flux supply part 43B, and then moves downward. When the semiconductor device is held by the stack head 42, the semiconductor device 40B is positioned so that the solder balls face downward. Thus, when stack head 42 moves downward, the solder balls 7 are put into the flux 50 filled in the flux filling groove 58 as shown in FIG. 52. Thereby, the flux 50 is transferred onto the solder balls 7.

The flux 50 is transferred onto only the solder balls 70, and the flux 50 does not adhere to other parts of the semiconductor device 40A such as the seal resin 2. That is, the flux 50 is present only in the flux filling groove 58 of the flux supply part 43B, and the flux filling groove 58 has a configuration corresponding to the arrangement of the solder balls 7. Additionally, when filling the flux 50 into the flux filling groove 58, the flux 50 is prevented from remaining on portions other than the flux filing groove 58.

Accordingly, when the solder balls 7 of the semiconductor device 40B are put into the flux 50 in the flux filling groove 58, the flux 50 is transferred only to the solder balls 7. Thus, a short circuit between adjacent solder balls and adjacent ball pads can be prevented, thereby improving a reliability of the stacked structure of the semiconductor devices.

Figure 53:
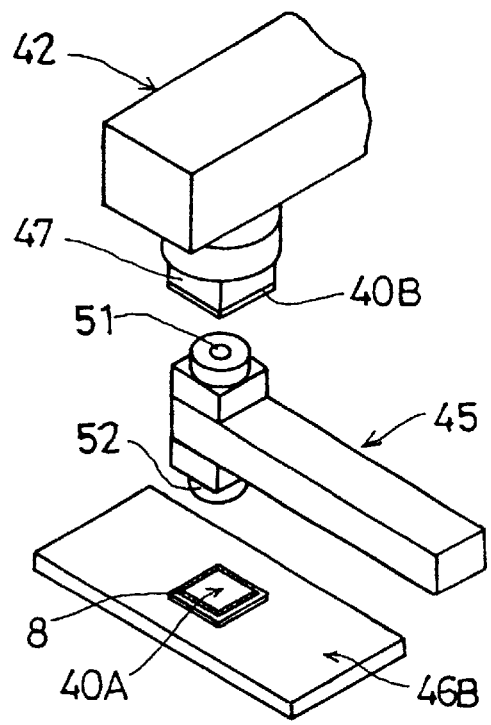
FIG. 53 is a perspective view of a camera unit recognizing positions of the semiconductor devices.
Figure 54:
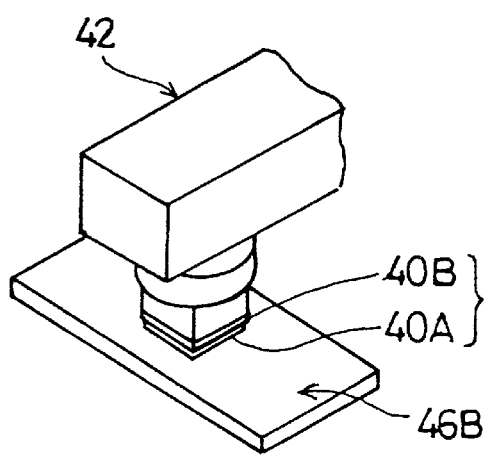
FIG. 54 is a perspective view showing a stack head stacking the semiconductor devices.

After the transfer process of the flux 50 to the solder balls 7, the stack head 42 conveys the semiconductor device 40B to a position above the carrier stage 46B. That is, the semiconductor device 40B is moved to a position opposite to the semiconductor device 40A. At the same time, the camera unit 45 moves to a position above the carrier stage 46A where the lower camera 52 is opposite to the semiconductor device 40A attached to the carrier stage 46A. Thereby, the semiconductor device 40A is positioned on the lower side and the semiconductor device 40B is positioned on the upper side with the camera unit 45 located therebetween as shown in FIG. 53. Accordingly, the upper camera 51 can recognize the positions of the ball pads 8 of the semiconductor device 40B, and the lower camera 52 can recognize the positions of the solder balls 7 of the semiconductor device 40A.

Figure 55:
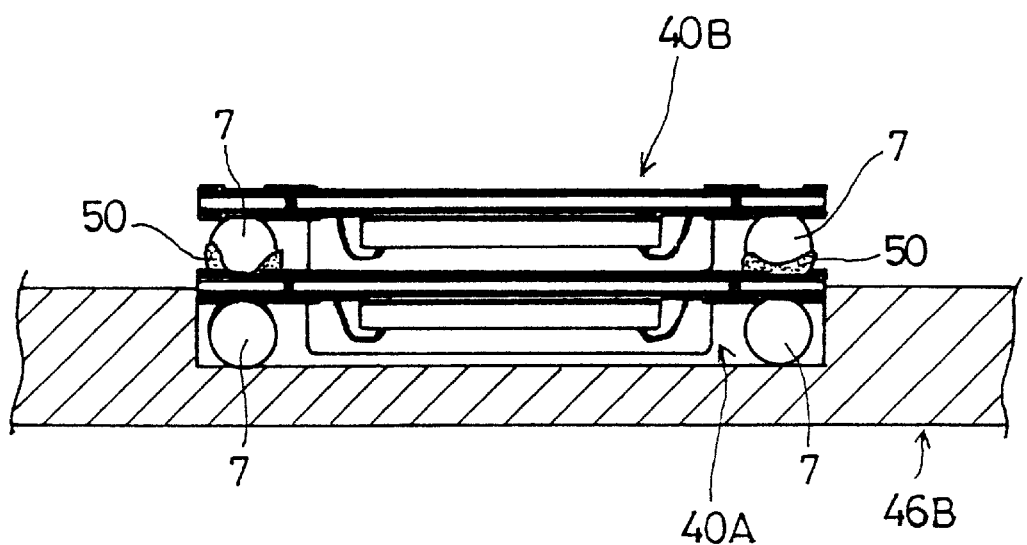
FIG. 55 is a side view of the semiconductor devices in a stacked state.

After the recognition of the positions of the ball pads 8 and the solder balls 7, the stack head 42 places the semiconductor device 40B on the semiconductor device 40A so that the ball pads 8 of the semiconductor device 40B contacts the respective solder balls 7 of the semiconductor device 40A. Thereby, the semiconductor devices 40A and 40B are arranged in the stacked state as shown in FIG. 55. In this state, since the flux 50 is transferred onto the upper portion of each of the solder balls 7, the flux 50 does not exist between the seal resin 2 of the upper semiconductor device 40B and the interposer 1 of the lower semiconductor device 40A.

In the state shown in FIG. 55, the semiconductor devices 40A and 40B are temporarily connected to each other by the flux 50 between the solder balls 7 of the semiconductor device 40A and the ball pads 8 of the semiconductor device 40B. The semiconductor devices 40A and 40B are fixed to each other by bonding the solder balls 7 to the ball pads 8 by placing the carrier stage 46A in a reflow furnace in a state in which the semiconductor devices 40A and 40B are stacked.

It should be noted that, although two semiconductor devices 40A and 40B are stacked in the present embodiment, an arbitrary number of semiconductor devices can be stacked by repeating the above-mentioned process.

The present invention is not limited to the specifically disclosed embodiments, and variations and modifications may be made without departing from the scope of the present invention.

The present application is based on Japanese priority applications No. 11-340816 filed Nov. 30, 1999 and No. 2000-068986 filed Mar. 13, 2000, the entire contents of which are hereby incorporated by reference.

What is claimed is:

1. A method for manufacturing a semiconductor device comprising first and second semiconductor elements and a redistribution substrate having a first surface and a second surface opposite to the first surface, the first semiconductor element mounted on the first surface and the second semiconductor element mounted on the second surface, the method comprising the steps of:

mounting the first semiconductor device on the first surface of the redistribution substrate;

placing the redistribution substrate on a jig after turning over the redistribution substrate, the jig having a depression in which the first semiconductor element is accommodated, the jig also having a buffer member supporting the first semiconductor element in the depression; and mounting the second semiconductor element on the second surface of the redistribution substrate.

2. A method for stacking a plurality of semiconductor devices each of which comprises: a redistribution substrate; a semiconductor element mounted on the redistribution substrate and protected by a package; a plurality of protruding electrodes arranged on the redistribution substrate; and a plurality of electrode pads provided on a surface opposite to a surface on which the protruding electrodes are provided so that the electrode pads are opposite to the respective protruding electrodes, wherein the semiconductor devices are stacked by connecting the protruding electrodes of one of the semiconductor devices to the electrode pads of one of the semiconductor devices located on an upper side, the method comprising the steps of:

placing each semiconductor device so that the protruding electrodes face upward; and applying flux to the protruding electrodes by using a transfer head carrying the flux in a shape corresponding to an arrangement of the protruding electrodes so that the flux is applied only to the protruding electrodes.

3. A method for stacking a plurality of semiconductor devices each of which comprises: a redistribution substrate; a semiconductor element mounted on the redistribution substrate and protected by a package; a plurality of protruding electrodes arranged on the redistribution substrate; and a plurality of electrode pads provided on a surface opposite to a surface on which the protruding electrodes are provided so that the electrode pads are opposite to the respective protruding electrodes, wherein the semiconductor devices are stacked by connecting the protruding electrodes of one of the semiconductor devices to the electrode pads of one of the semiconductor devices located on an upper side, the method comprising the steps of:

conveying each semiconductor device to a flux applying position at which a flux applying member is located in a state in which the protruding electrodes of the semiconductor device face downward, the flux applying member having a flux filling part corresponding to an area in which the protruding electrodes are arranged; and applying flux to the protruding electrodes by putting the protruding electrodes into the flux filled in the flux filling part.

\* \* \* \* \*